(12) United States Patent
Matsumaru et al.

(10) Patent No.: US 7,482,108 B2
(45) Date of Patent: Jan. 27, 2009

(54) POLYMER COMPOUND, ACID GENERATOR, POSITIVE RESIST COMPOSITION, AND METHOD FOR FORMATION OF RESIST PATTERNS

(75) Inventors: Shogo Matsumaru, Kawasaki (JP); Masaru Takeshita, Kawasaki (JP); Takeshi Iwai, Kawasaki (JP); Hideo Hada, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 10 days.

(21) Appl. No.: 11/572,990

(22) PCT Filed: Jul. 1, 2005

(86) PCT No.: PCT/JP2005/012201

§ 371 (c)(1),
(2), (4) Date: Jan. 30, 2007

(87) PCT Pub. No.: WO2006/013687

PCT Pub. Date: Feb. 9, 2006

(65) Prior Publication Data

US 2007/0231708 A1    Oct. 4, 2007

(30) Foreign Application Priority Data

Aug. 3, 2004    (JP) .............................. 2004-226735

(51) Int. Cl.
*G30F 7/00*    (2006.01)
*G30F 7/004*    (2006.01)

(52) U.S. Cl. ..................... 430/270.1; 430/905; 430/913

(58) Field of Classification Search .............. 430/270.1, 430/905, 913
See application file for complete search history.

(56) References Cited

U.S. PATENT DOCUMENTS

| 6,111,143 A | 8/2000 | Park et al. |
| 2006/0147836 A1 * | 7/2006 | Hatakeyama et al. .... 430/270.1 |
| 2007/0111140 A1 * | 5/2007 | Hatakeyama et al. .... 430/270.1 |

FOREIGN PATENT DOCUMENTS

| JP | 04-039665 | 2/1992 |
| JP | 10221852 | 8/1998 |
| JP | 11338146 | 12/1999 |
| JP | 2004-162040 | 6/2004 |
| JP | 2004-184636 | 7/2004 |
| JP | 2005-084365 | 3/2005 |
| WO | WO 2004/050728 A2 | 6/2004 |

OTHER PUBLICATIONS

International Search Report for PCT/JP2005/012201 dated Oct. 4, 2005.
Supplementary European Search Report from PCT/JP2005/012201 received Sep. 6, 2007.

* cited by examiner

*Primary Examiner*—Amanda C. Walke
(74) *Attorney, Agent, or Firm*—Knobbe, Martens, Olson & Bear LLP

(57) ABSTRACT

The invention provides a polymer compound capable of forming a positive resist composition that can form a high-resolution pattern with a reduced level of LER, an acid generator formed from such a polymer compound, a positive resist composition that includes such a polymer compound, and a method for forming a resist pattern that uses such a positive resist composition. The polymer compound includes a structural unit (a1) derived from an (α-lower alkyl) acrylate ester having an acid-dissociable, dissolution-inhibiting group, a structural unit (a2) represented by a general formula (a2-1) shown below [wherein, R represents a hydrogen atom or a lower alkyl group; A represents a divalent organic group; B represents a monovalent organic group; X represents a sulfur atom or iodine atom; n represents either 1 or 2; and Y represents a straight-chain, branched or cyclic alkyl group in which at least one hydrogen atom may be substituted with a fluorine atom], and a structural unit (a3) derived from an (α-lower alkyl) acrylate ester that contains a polar group-containing aliphatic polycyclic group.

[Formula 1]

(a2-1)

$$\left\{\begin{array}{c}\phantom{x}\\ \underset{\phantom{x}}{\overset{H_2}{C}}\end{array}\,\underset{\underset{\underset{\underset{\underset{\phantom{x}}{_n(B\!\!\rightarrow\!\!X^{\oplus}\quad Y\!-\!SO_3^{\ominus}}}{A}}{O}}{\overset{O}{\underset{\phantom{x}}{C}}}}{\overset{R}{\underset{\phantom{x}}{C}}}\right\}$$

18 Claims, No Drawings

POLYMER COMPOUND, ACID GENERATOR, POSITIVE RESIST COMPOSITION, AND METHOD FOR FORMATION OF RESIST PATTERNS

RELATED APPLICATIONS

This application is the U.S. National Phase filing under 35 U.S.C. §371 of PCT/JP2005/012201, filed Jul. 1, 2005, which designated the United States and was published in a language other than English, which claims priority under 35 U.S.C. §119(a)-(d) to Japanese Patent Application No. 2004-226735, filed Aug. 3, 2004. The content of these applications is incorporated herein by reference in their entireties.

TECHNICAL FIELD

The present invention relates to a polymer compound, an acid generator, a positive resist composition, and a method for formation of resist patterns.

BACKGROUND ART

In recent years, in the production of semiconductor elements and liquid crystal display elements, advances in lithography techniques have lead to rapid progress in the field of miniaturization. Typically, these miniaturization techniques involve shortening the wavelength of the exposure light source. Conventionally, ultraviolet radiation typified by g-line and i-line radiation has been used, but nowadays, mass production of semiconductor elements using KrF excimer lasers and ArF excimer lasers is starting to be introduced. Furthermore, investigations are also being conducted into the use of wavelengths even shorter than these excimer lasers, including $F_2$ excimer lasers, electron beams, extreme ultraviolet radiation, and X-ray radiation.

One example of a known resist material that satisfies the high resolution properties necessary for reproducing patterns of minute dimensions is a chemically amplified resist composition, which includes a base resin that undergoes a change in alkali solubility under the action of acid, and an acid generator that generates acid on exposure. These chemically amplified resist compositions include negative compositions that contain an alkali-soluble resin, an acid generator and a cross-linking agent, and positive compositions that contain a resin that exhibits increased alkali solubility under the action of acid, and an acid generator. These resist materials are usually dissolved in an organic solvent prior to use.

[Patent Reference 1]
Japanese Patent (Granted) Publication No. 2,881,969.

DISCLOSURE OF INVENTION

Problems to be Solved by the Invention

When a pattern is formed using this type of resist material, a problem arises in that roughness can develop in the side wall surfaces of the resist pattern, namely, line edge roughness (LER). LER can cause distortions around the holes in a hole pattern, and fluctuations in the line width in line and space patterns, and consequently has the potential to adversely affect the formation of very fine semiconductor elements. Accordingly, in recent years, as the miniaturization of resist patterns has continued to progress and the demands for higher levels of resolution have increased, improving LER levels has become a significant issue.

The present invention addresses the circumstances described above, with an object of providing a polymer compound capable of forming a positive resist composition that can form a high-resolution pattern with a reduced level of LER, an acid generator formed from such a polymer compound, a positive resist composition that includes such a polymer compound, and a method for forming a resist pattern that uses such a positive resist composition.

Means for Solving the Problems

In order to achieve the object described above, the present invention adopts the aspects described below.

A first aspect of the present invention is a polymer compound containing a structural unit (a1) derived from an (α-lower alkyl) acrylate ester having an acid-dissociable, dissolution-inhibiting group, a structural unit (a2) represented by a general formula (a2-1) shown below:

[Formula 1]

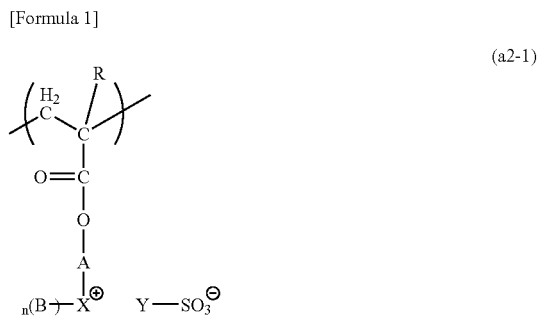

[wherein, R represents a hydrogen atom or a lower alkyl group; A represents a divalent organic group; B represents a monovalent organic group; X represents a sulfur atom or iodine atom; n represents either 1 or 2; and Y represents a straight-chain, branched or cyclic alkyl group in which at least one hydrogen atom may be substituted with a fluorine atom], and a structural unit (a3) derived from an (α-lower alkyl) acrylate ester that contains a polar group-containing aliphatic polycyclic group.

A second aspect of the present invention is an acid generator formed from a polymer compound according to the first aspect described above.

A third aspect of the present invention is a positive resist composition that includes a polymer compound according to the first aspect described above.

A fourth aspect of the present invention is a positive resist composition that includes a resin component (A) that exhibits increased alkali solubility under the action of acid, and an acid generator component (B) that generates acid on exposure, wherein
the resin component (A) includes a polymer compound according to the first aspect described above.

A fifth aspect of the present invention is a positive resist composition that includes a resin component (A) that exhibits increased alkali solubility under the action of acid, and an acid generator component (B) that generates acid on exposure, wherein
the acid generator component (B) includes an acid generator according to the second aspect described above.

A sixth aspect of the present invention is a method for forming a resist pattern, including the steps of forming a resist film on a substrate using a positive resist composition according to any one of the third, fourth and fifth aspects described above, exposing the resist film, and developing the resist film to form a resist pattern.

In the present invention, the term "structural unit" refers to a monomer unit that contributes to the formation of a polymer.

Furthermore, the term "exposure" is used as a general concept that includes irradiation with any form of radiation.

Effects of the Invention

According to the present invention, a polymer compound capable of forming a positive resist composition that can form a high-resolution pattern with a reduced level of LER, an acid generator formed from such a polymer compound, a positive resist composition that includes such a polymer compound, and a method for forming a resist pattern that uses such a positive resist composition can be provided.

BEST MODE FOR CARRYING OUT THE INVENTION

As follows is a more detailed description of the present invention.

<<Polymer Compound of the First Aspect>>

A polymer compound of the first aspect of the present invention (hereafter also referred to as the polymer compound (A1)) contains a structural unit (a1) derived from an (α-lower alkyl) acrylate ester having an acid-dissociable, dissolution-inhibiting group, a structural unit (a2) represented by the general formula (a2-1) shown above, and a structural unit (a3) derived from an (α-lower alkyl) acrylate ester that contains a polar group-containing aliphatic polycyclic group.

Structural Unit (a1)

The structural unit (a1) is a structural unit derived from an (α-lower alkyl) acrylate ester having an acid-dissociable, dissolution-inhibiting group.

In the present invention, the expression "(α-lower alkyl) acrylate ester" is a generic term that includes an acrylate ester and α-lower alkyl acrylate esters such as a methacrylate ester.

Furthermore, the lower alkyl group that functions as the α-position substituent within an "(α-lower alkyl) acrylate ester" is typically an alkyl group of 1 to 5 carbon atoms, and specific examples of suitable groups include straight-chain or branched lower alkyl groups such as a methyl group, ethyl group, propyl group, isopropyl group, n-butyl group, isobutyl group, tert-butyl group, pentyl group, isopentyl group or neopentyl group.

The expression "structural unit derived from an (α-lower alkyl) acrylate ester" refers to a structural unit that is formed by the cleavage of the ethylenic double bond of the (α-lower alkyl) acrylate ester.

The acid-dissociable, dissolution-inhibiting group in the structural unit (a1) can use any of the groups that have been proposed as acid-dissociable, dissolution-inhibiting groups for the base resins of chemically amplified resists, provided the group has an alkali dissolution-inhibiting effect that renders the entire polymer compound (A1) alkali-insoluble prior to exposure, and then following dissociation, causes the entire polymer compound (A1) to change to an alkali-soluble state. Generally, groups that form either a cyclic or chain-like tertiary alkyl ester or a chain-like or cyclic alkoxyalkyl group with the carboxyl group of the (meth)acrylate ester are the most widely known. Here, the term "(meth)acrylate ester" is a generic term that includes the acrylate ester and the methacrylate ester.

Specific examples of the structural unit (a1) include the structural units represented by general formulas (a1-1) to (a1-4) shown below.

[Formula 2]

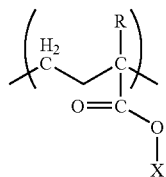
(a1-1)

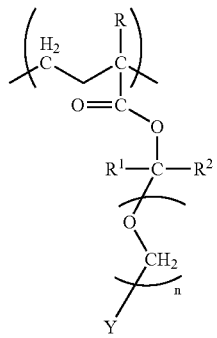
(a1-2)

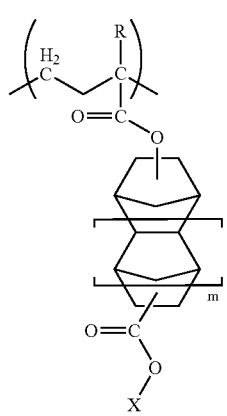
(a1-3)

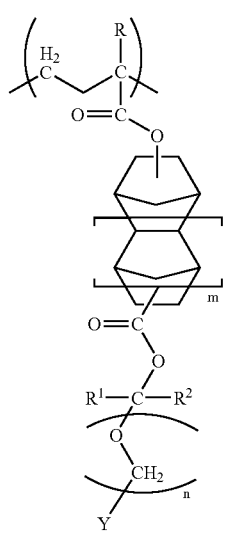
(a1-4)

[In the above formulas, X represents an acid-dissociable, dissolution-inhibiting group that contains an aliphatic branched group or aliphatic cyclic group, Y represents an aliphatic cyclic group, n represents either 0 or an integer from 1 to 3, m represents either 0 or 1, and $R^1$ and $R^2$ each represent, independently, a hydrogen atom or a lower alkyl group of 1 to 5 carbon atoms.]

In this description, the term "aliphatic" is a relative concept used in relation to the term "aromatic", and defines a group or compound that has no aromaticity.

Furthermore, the term "aliphatic cyclic group" describes a monocyclic group or polycyclic group (alicyclic group) that has no aromaticity, and although the "aliphatic cyclic group" need not necessarily be a group formed solely from carbon and hydrogen (namely, a hydrocarbon group), a hydrocarbon group is preferred. Furthermore, the "hydrocarbon group" may be either saturated or unsaturated, but is preferably saturated. A polycyclic group (alicyclic group) is particularly desirable.

Specific examples of this type of aliphatic cyclic group include groups in which one or more hydrogen atoms have been removed from a polycycloalkane such as a monocycloalkane, bicycloalkane, tricycloalkane or tetracycloalkane, which may, or may not, be substituted with a fluorine atom or a fluorinated alkyl group. Specific examples of suitable groups include groups in which one or more hydrogen atoms have been removed from a monocycloalkane such as cyclopentane or cyclohexane, or a polycycloalkane such as adamantane, norbornane, isobornane, tricyclodecane or tetracyclododecane.

Specific examples of groups of the above general formulas (a1-1) to (a1-4) are shown below.

[Formula 3]

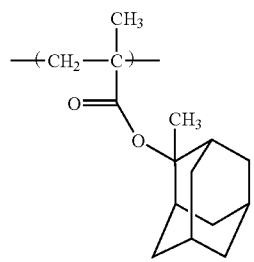
(a1-1-1)

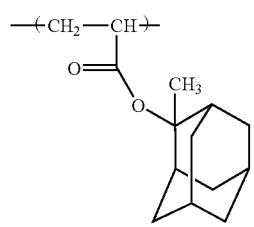
(a1-1-2)

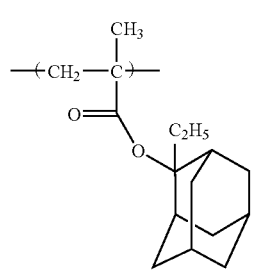
(a1-1-3)

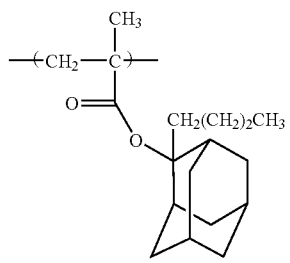
(a1-1-4)

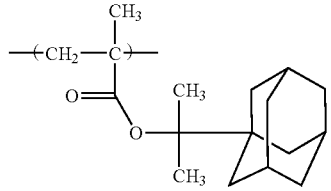
(a1-1-5)

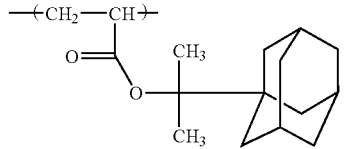
(a1-1-6)

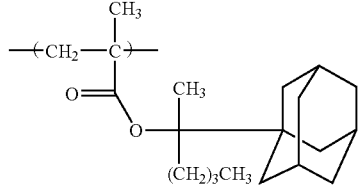
(a1-1-7)

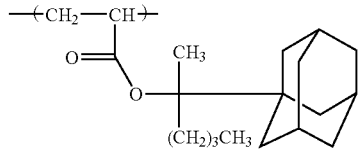
(a1-1-8)

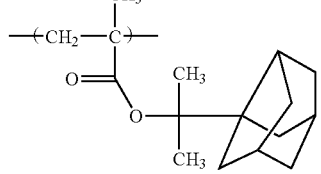
(a1-1-9)

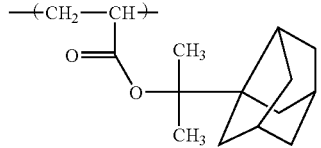
(a1-1-10)

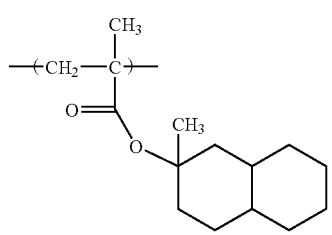
(a1-1-11)

(a1-1-12) 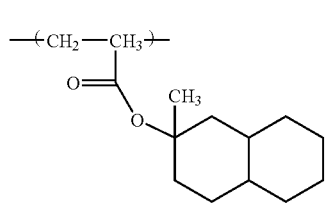
(a1-1-13) 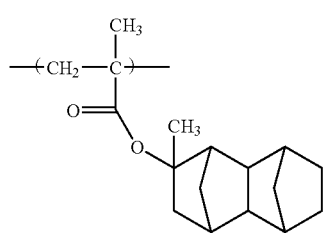
(a1-1-14) 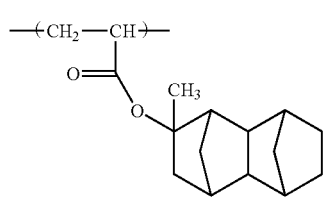
(a1-1-15) 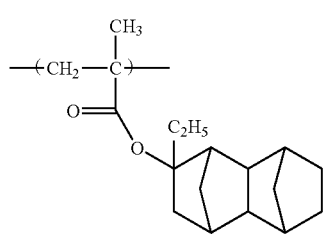
(a1-1-16) 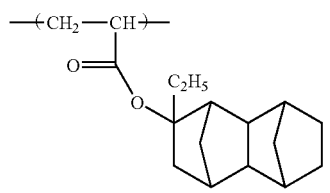
[Formula 4]
(a1-1-17) 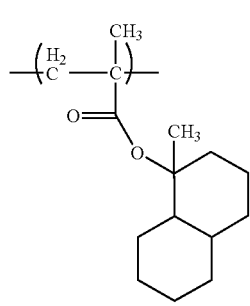
(a1-1-18) 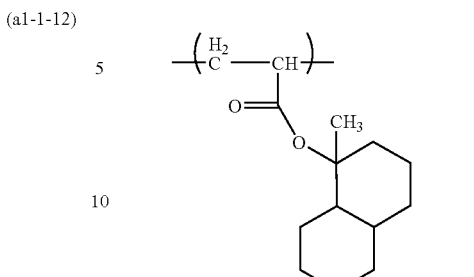
(a1-1-19) 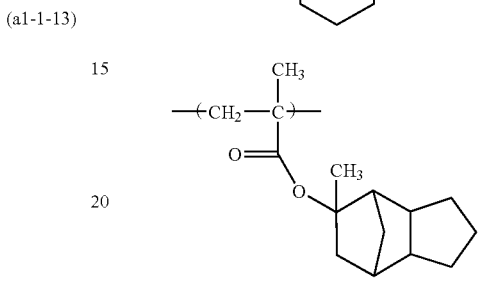
(a1-1-20) 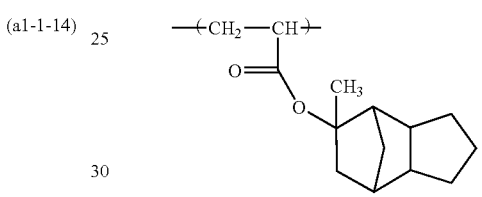
(a1-1-21) 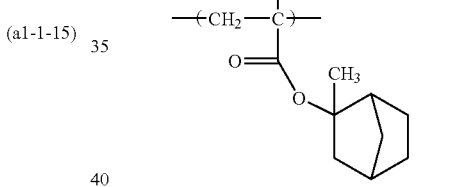
(a1-1-22) 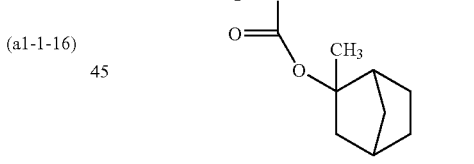
(a1-1-23) 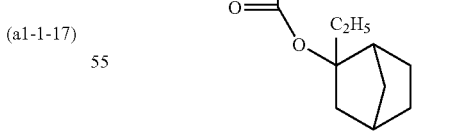
(a1-1-24) 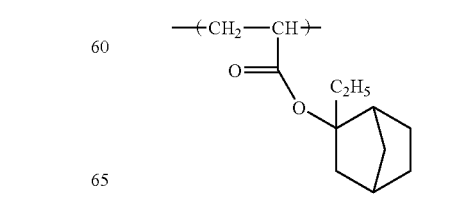

(a1-1-25) 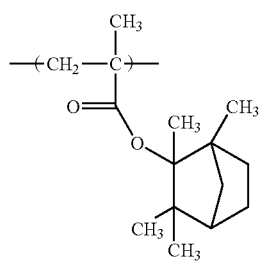
(a1-1-26) 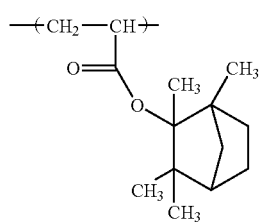
(a1-1-27) 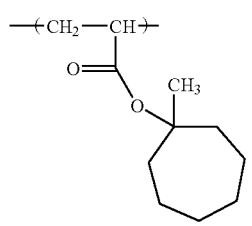
(a1-1-28) 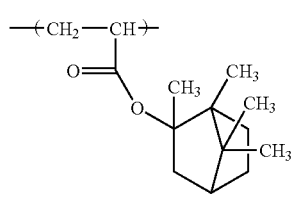
(a1-1-29) 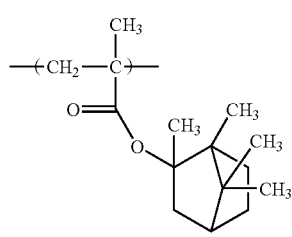
(a1-1-30) 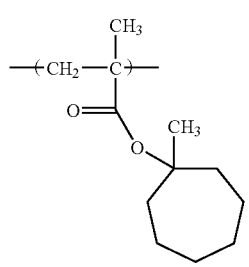
(a1-1-31) 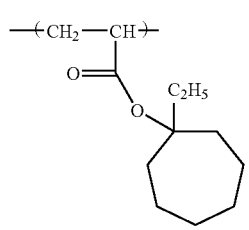
(a1-1-32) 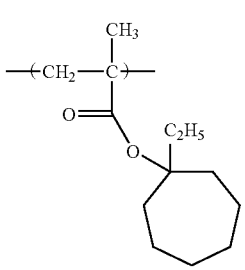
[Formula 5]
(a1-1-33) 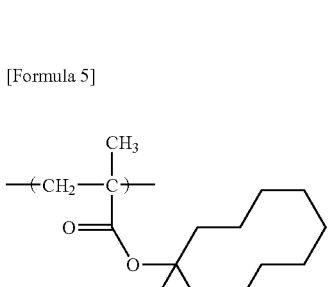
(a1-1-34) 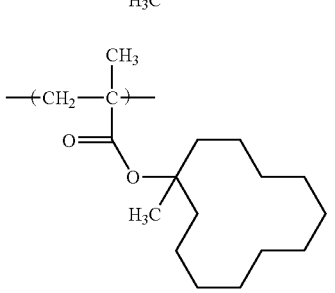
(a1-1-35) 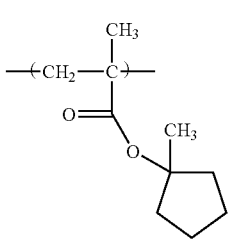
(a1-1-36) 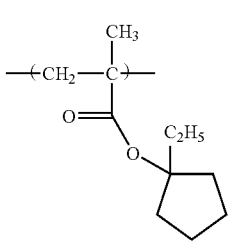
(a1-1-37) 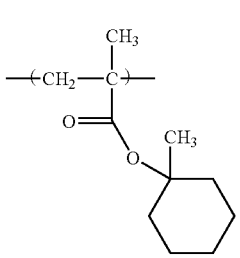

(a1-1-38)
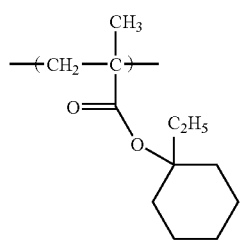
(a1-1-39)
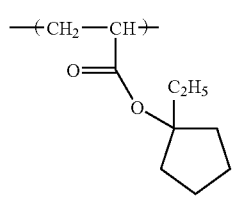
(a1-1-40)
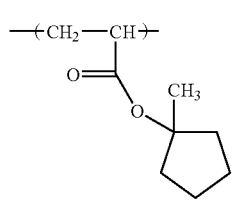
[Formula 6]
(a1-2-1)
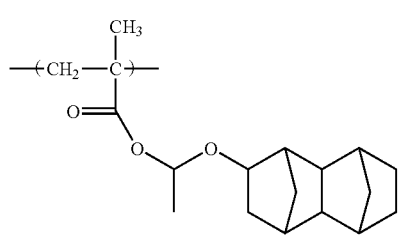
(a1-2-2)
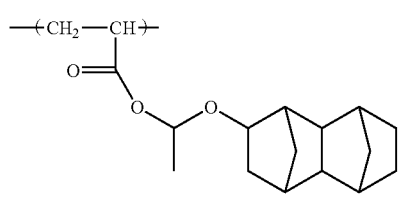
(a1-2-3)
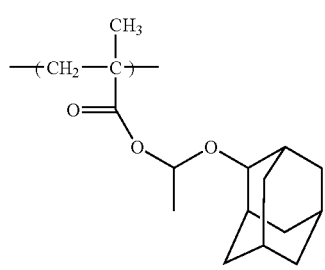
(a1-2-4)
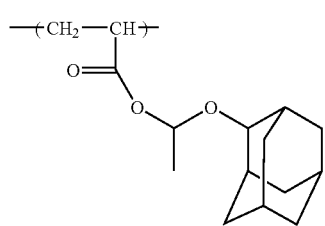
(a1-2-5)
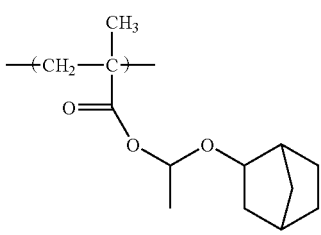
(a1-2-6)
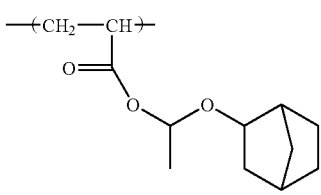
[Formula 7]
(a1-2-7)
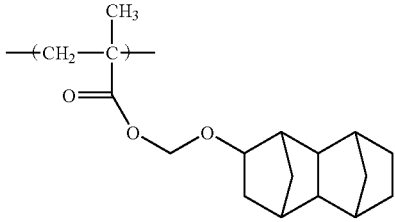
(a1-2-8)
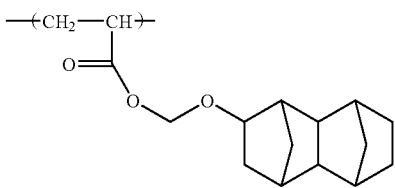
(a1-2-9)
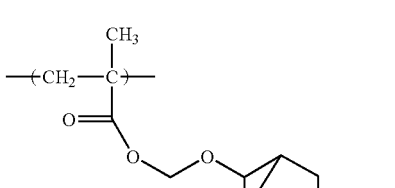
(a1-2-10)
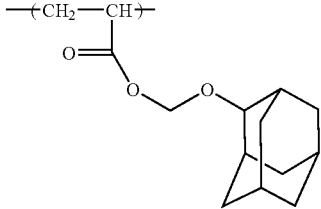
(a1-2-11)
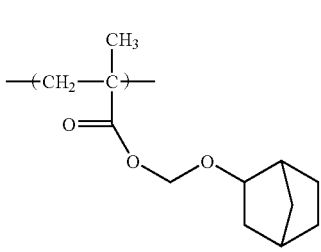

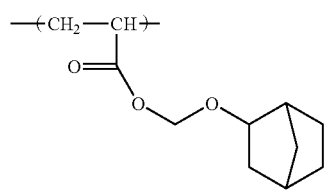 (a1-2-12)
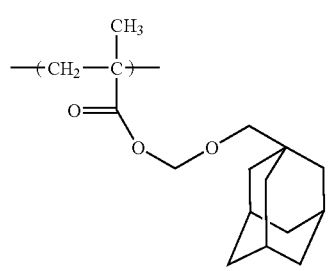 (a1-2-13)
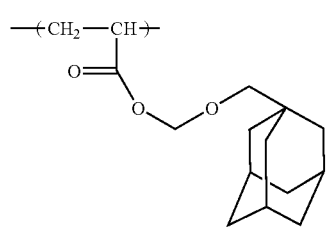 (a1-2-14)
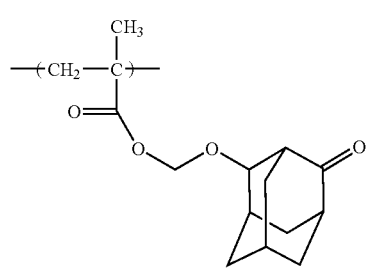 (a1-2-15)
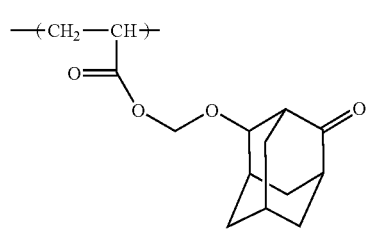 (a1-2-16)
[Formula 8]
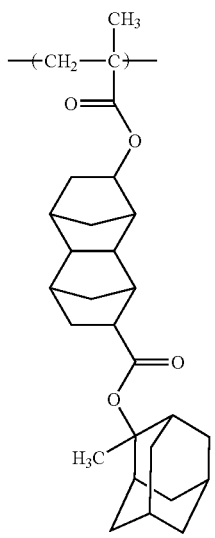 (a1-3-1)
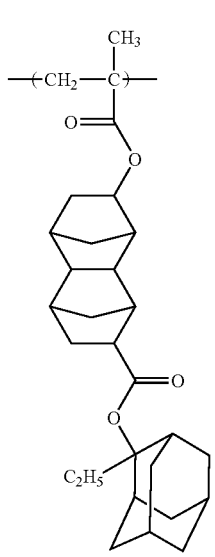 (a1-3-2)
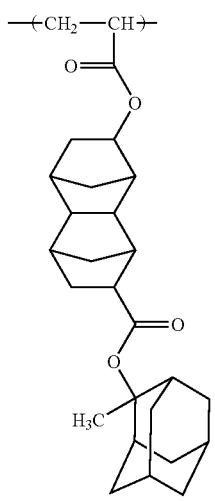 (a1-3-3)

-continued
(a1-3-4)
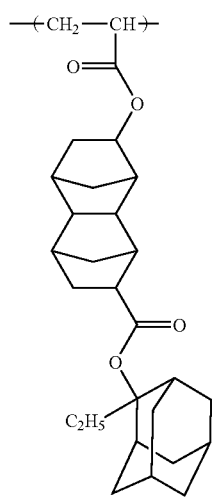
(a1-3-5)
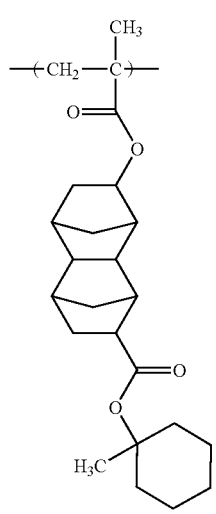
(a1-3-6)
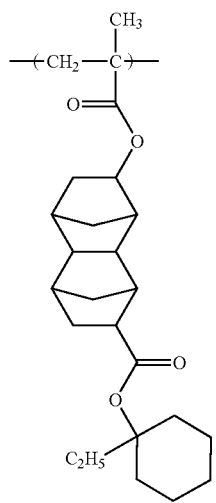
-continued
(a1-3-7)
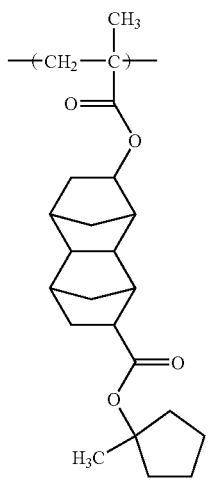
(a1-3-8)
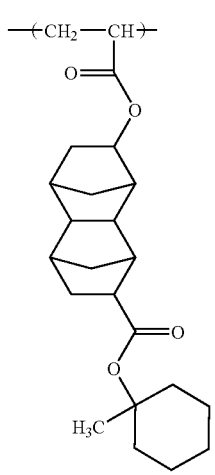
(a1-3-9)

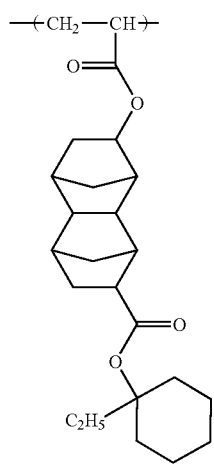
(a1-3-10)
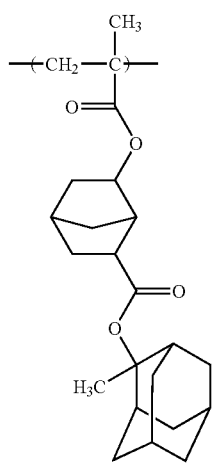
(a1-3-13)
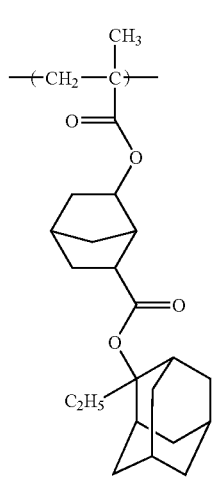
(a1-3-11)
(a1-3-14)
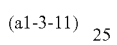
(a1-3-12)
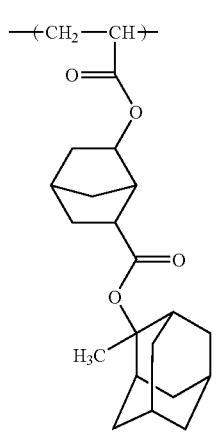
(a1-3-15)
[Formula 9]

-continued
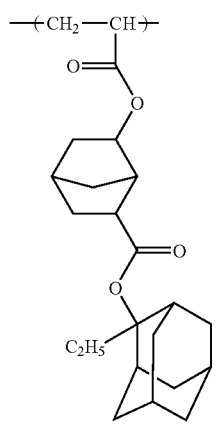 (a1-3-16)
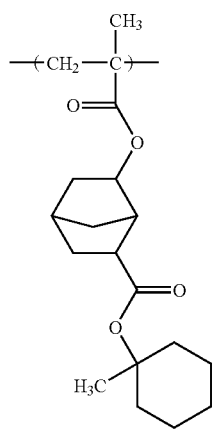 (a1-3-17)
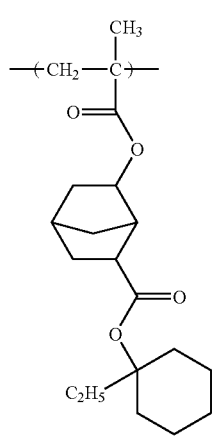 (a1-3-18)
-continued
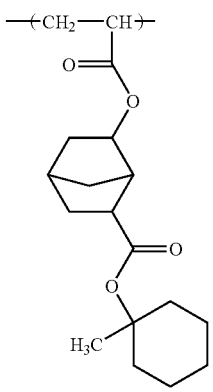 (a1-3-19)
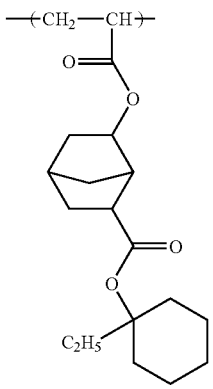 (a1-3-20)
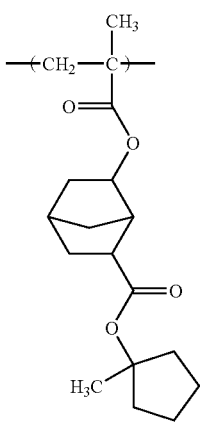 (a1-3-21)
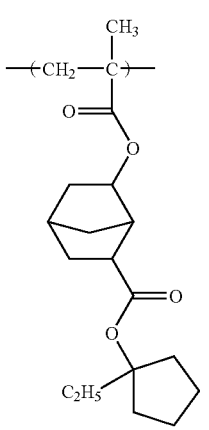 (a1-3-22)

-continued
(a1-3-23)
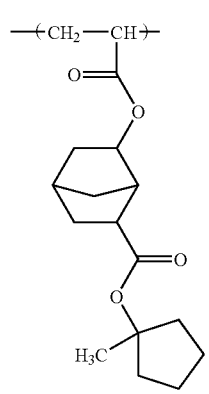
(a1-3-24)
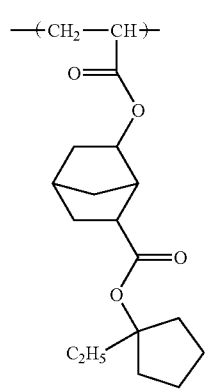
[Formula 10]
(a1-4-1)
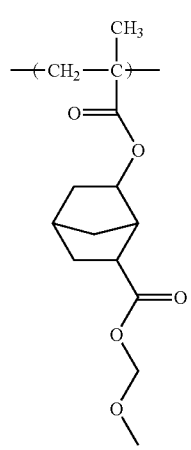
(a1-4-2)
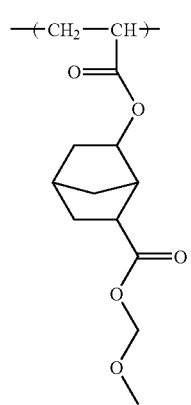
-continued
(a1-4-3)
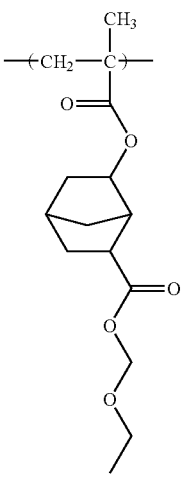
(a1-4-4)
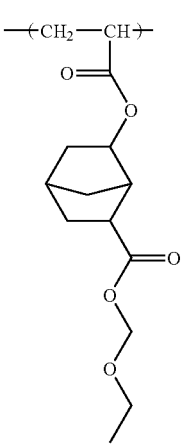
(a1-4-5)
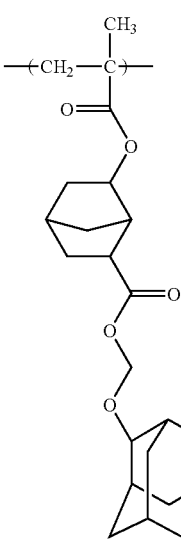

(a1-4-6)
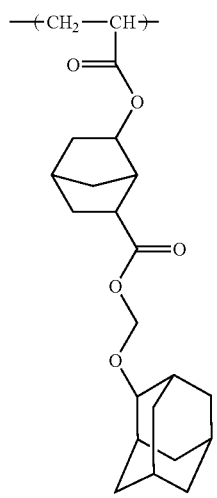
(a1-4-7)
(a1-4-8)
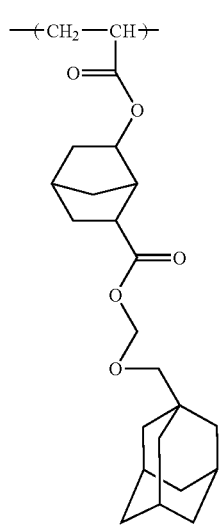
(a1-4-9)
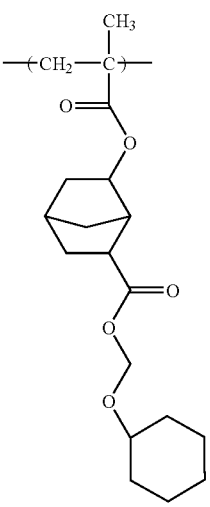
(a1-4-10)
(a1-4-11)
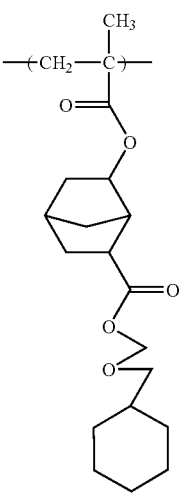

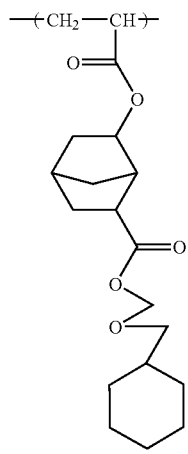
(a1-4-12)
[Formula 11]
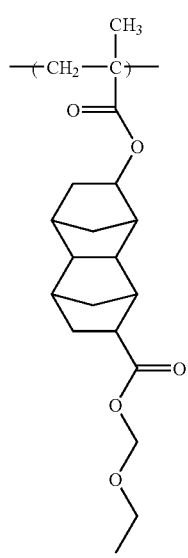
(a1-4-13)
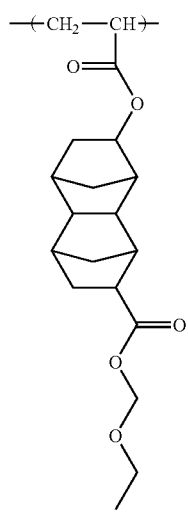
(a1-4-14)
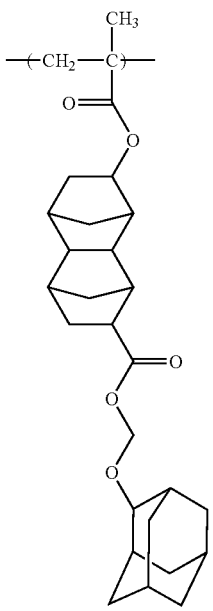
(a1-4-15)
(a1-4-16)

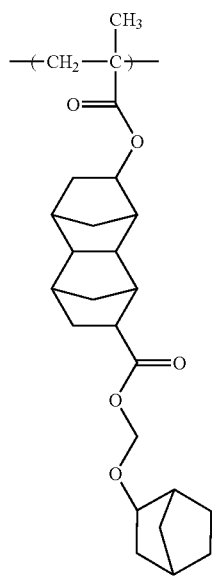
(a1-4-17)
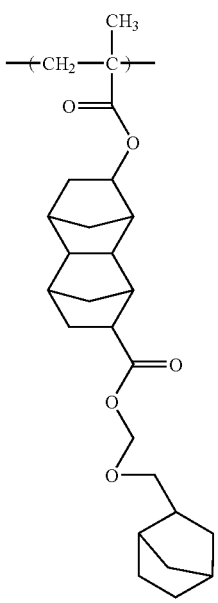
(a1-4-19)
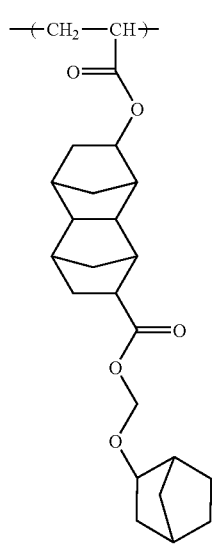
(a1-4-18)
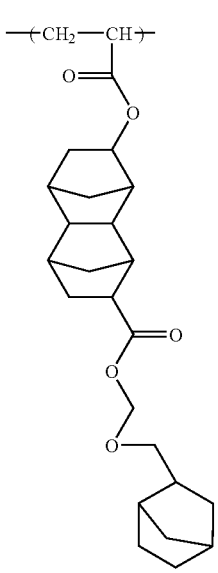
(a1-4-20)
[Formula 12]

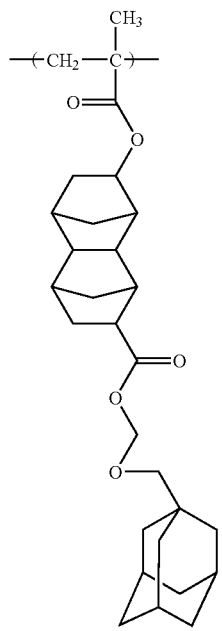 (a1-4-21)
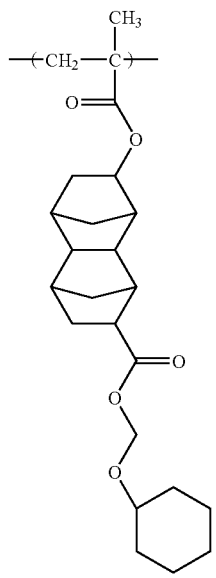 (a1-4-23)
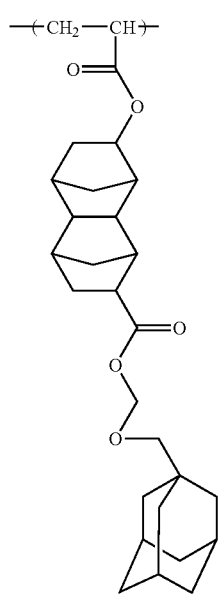 (a1-4-22)
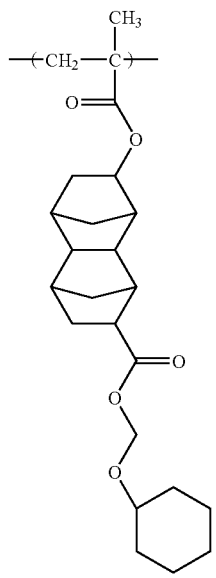 (a1-4-24)

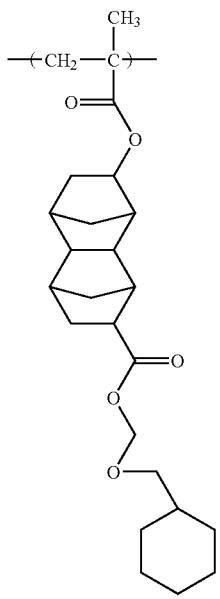

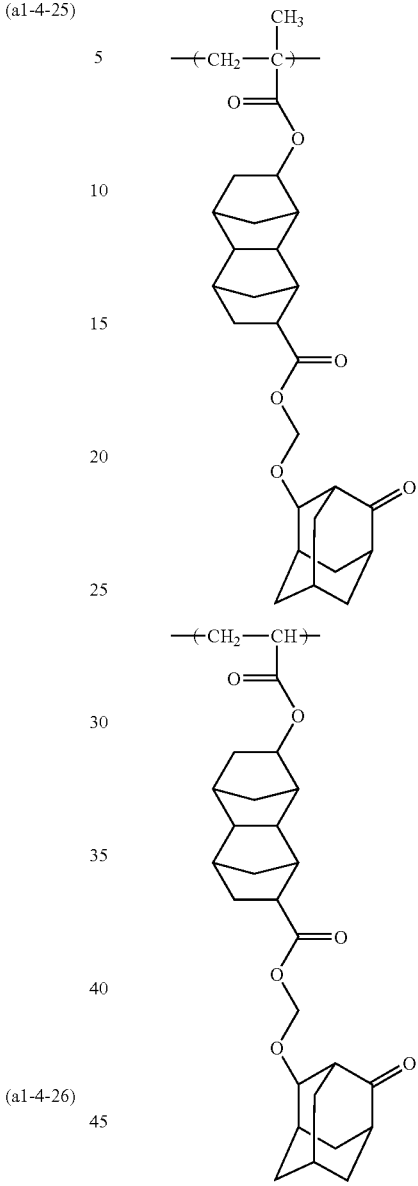

As the structural unit (a1), either a single type of structural unit may be used alone, or a combination of two or more different structural units may be used. Of the various possibilities, structural units represented by the general formula (a1-1) are preferred, and structural units represented by the formulas (a1-1-1) to (a1-1-6) are the most desirable.

The proportion of the structural unit (a1) within the polymer compound (A1), relative to the combined total of all the structural units that constitute the polymer compound (A1), is preferably within a range from 10 to 80 mol %, even more preferably from 15 to 70 mol %, and most preferably from 20 to 50 mol %. Ensuring that this proportion is at least as large as the lower limit of the above range enables a more favorable pattern to be obtained when the polymer is used in a resist composition, whereas ensuring that the proportion is no greater than the upper limit enables a more favorable balance to be achieved with the other structural units.

Structural Unit (a2)

The structural unit (a2) is a structural unit represented by the general formula (a2-1) shown above.

In the formula (a2-1), R represents a hydrogen atom or a lower alkyl group. The lower alkyl group represented by R is preferably an alkyl group of 1 to 5 carbon atoms, and specific examples of suitable groups include straight-chain and branched lower alkyl groups such as a methyl group, ethyl group, propyl group, isopropyl group, n-butyl group, isobutyl group, tert-butyl group, pentyl group, isopentyl group and neopentyl group.

Examples of the divalent organic group represented by A include straight-chain, branched or cyclic alkylene groups of 1 to 20 carbon atoms, and groups in which two hydrogen atoms have been removed from an aromatic ring structure of 4 to 20 carbon atoms, and within these groups, carbon atoms may be substituted with a hetero atom such as an oxygen atom. Particularly preferred groups include straight-chain, branched or cyclic alkylene groups of 1 to 10 carbon atoms (such as a methylene group, ethylene group, propylene group, or cyclohexylene group), and groups in which two hydrogen atoms have been removed from an aromatic ring structure of 6 to 15 carbon atoms (such as a phenylene group or naphthylene group).

These alkylene groups or aromatic ring structures may also contain substituent groups. There are no particular restrictions on these substituent groups, and suitable examples include straight-chain or branched alkyl groups of 1 to 20 carbon atoms, and a hydroxyl group or the like. From the viewpoint of ensuring superior resolution, alkyl groups of 1 to 10 carbon atoms are preferred, and alkyl groups of 1 to 5 carbon atoms are particularly desirable. Specific examples of suitable groups include a methyl group, ethyl group, n-propyl group, isopropyl group, n-butyl group, isobutyl group, n-pentyl group, cyclopentyl group, hexyl group, cyclohexyl group, nonyl group and decanyl group. A methyl group is particularly preferred from the view point of yielding superior resolution, and enabling low-cost synthesis.

Examples of the monovalent organic group represented by B include straight-chain, branched, or cyclic alkyl groups of 1 to 20 carbon atoms, and groups in which one hydrogen atom has been removed from an aromatic ring structure of 4 to 20 carbon atoms, and within these groups, carbon atoms may be substituted with a hetero atom such as an oxygen atom or nitrogen atom. Particularly preferred groups include straight-chain, branched, or cyclic alkyl groups of 1 to 10 carbon atoms (such as a methyl group, ethyl group, propyl group, or cyclohexyl group), and groups in which one hydrogen atom has been removed from an aromatic ring structure of 6 to 15 carbon atoms (such as a phenyl group or naphthyl group).

These alkyl groups or aromatic ring structures may also contain substituent groups. There are no particular restrictions on these substituent groups, and suitable examples include the same straight-chain, branched or cyclic alkyl groups of 1 to 20 carbon atoms as those described above as suitable substituent groups within the group A.

The group X represents a sulfur atom or an iodine atom, and is preferably a sulfur atom.

n represents either 1 or 2, and when X represents a sulfur atom, n=2, whereas when X represents an iodine atom, n=1.

The straight-chain, branched or cyclic alkyl group represented by Y preferably contains from 1 to 10 carbon atoms, and even more preferably from 1 to 8 carbon atoms, and most preferably from 1 to 4 carbon atoms. In these alkyl groups, at least one hydrogen atom may be substituted with a fluorine atom, and alkyl groups in which all of the hydrogen atoms have been substituted with fluorine atoms are particularly preferred. As the group Y, straight-chain alkyl groups in which all of the hydrogen atoms have been substituted with fluorine atoms are particularly desirable.

As the structural unit (a2), structural units represented by a general formula (a2-2) shown below yield particularly superior effects for the present invention, and are consequently preferred.

[Formula 13]

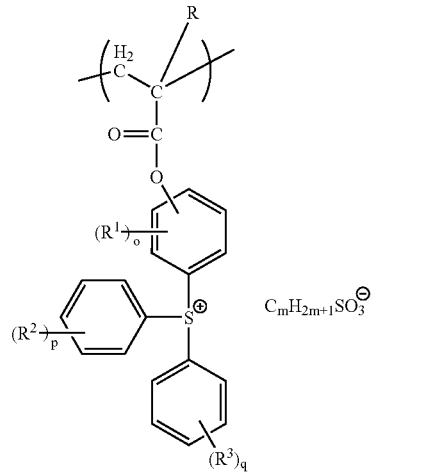

(a2-2)

[In the formula, R represents a hydrogen atom or a lower alkyl group; $R^1$ to $R^3$ each represent, independently, a straight-chain, branched, or cyclic alkyl group of 1 to 20 carbon atoms, or a hydroxyl group; o, p, and q each represent, independently, either 0 or an integer from 1 to 3; and m represents an integer from 1 to 10. The hydrogen atoms within the anion portion may be substituted with fluorine atoms.]

In the formula (a2-2), examples of the straight-chain, branched, or cyclic alkyl groups of 1 to 20 carbon atoms represented by $R^1$ to $R^3$ include the same alkyl groups that may include an alkyl group or aromatic ring that are exemplified above as potential substituent groups within the description relating to the group A.

o, p, and q each represent, independently, either 0 or an integer from 1 to 3, and it is preferred that o represents 2 and p and q both represent 0.

m represents an integer from 1 to 10, preferably an integer from 1 to 8, and even more preferably an integer from 1 to 4, and those cases where m is either 1 or 4 are the most preferred in view of the ease of industrial synthesis.

Furthermore, the alkyl group represented by $C_mH_{2m+1}$, may be either a straight-chain or a branched group, but is preferably a straight-chain alkyl group such as a methyl group, ethyl group, n-propyl group, n-butyl group, n-pentyl group, n-hexyl group, n-heptyl group, n-octyl group, n-nonyl group, or n-decyl group. Furthermore, at least 50%, even more preferably 80% or more, and most preferably 100%, of the hydrogen atoms of this alkyl group may be substituted with fluorine atoms.

Specific examples of the structural unit (a2) include the structural units represented by a general formula (a2-3) shown below.

[Formula 14]

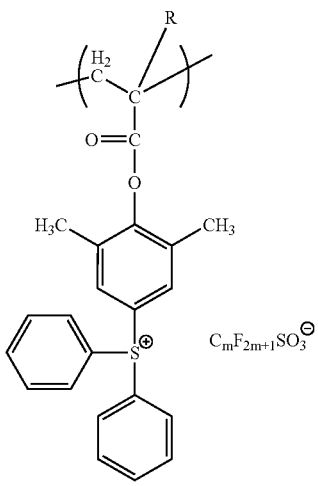

(a2-3)

[wherein, R represents a hydrogen atom or a lower alkyl group]

As the structural unit (a2), either a single type of structural unit may be used alone, or a combination of two or more different structural units may be used.

From the viewpoint of maximizing the effect of the present invention, the proportion of the structural unit (a2) within the polymer compound (Aa1), relative to the combined total of all the structural units that constitute the polymer compound (A1), is preferably at least 0.01 mol %, even more preferably 0.1 mol % or higher, and is most preferably 1 mol % or higher. Furthermore, considering the need to achieve a favorable balance with the other structural units, the upper limit for this proportion is preferably no higher than 70 mol %, even more preferably no higher than 50 mol %, even more preferably no higher than 30 mol %, and is most preferably 15 mol % or lower.

The structural unit (a2) can be synthesized easily by an esterification reaction between an (α-lower alkyl) acryloyl chloride and an onium salt that includes a hydroxyl group within the cation portion.

Structural Unit (a3)

The structural unit (a3) is a structural unit derived from an (α-lower alkyl) acrylate ester that contains a polar group-containing aliphatic hydrocarbon group. Including the structural unit (a3) enhances the hydrophilicity of the polymer compound (A1), thereby improving the affinity with the developing solution during resist pattern formation, improving the alkali solubility within the exposed portions of the resist, and contributing to an improvement in the resolution. Furthermore, LER is also reduced, although the reason for this observation remains unclear.

Examples of the polar group include a hydroxyl group or cyano group or the like, although a hydroxyl group is particularly preferred.

Examples of the aliphatic hydrocarbon group include straight-chain or branched hydrocarbon groups (alkylene groups) of 1 to 10 carbon atoms, and polycyclic aliphatic hydrocarbon groups (polycyclic groups). These polycyclic groups can be selected appropriately from the multitude of groups that have been proposed for the resins of resist compositions designed for use with ArF excimer lasers.

Of the various possibilities, structural units that contain a hydroxyl group, cyano group or carboxyl group-containing aliphatic polycyclic group, and are also derived from a (meth) acrylate ester are particularly preferred. Examples of suitable polycyclic groups include groups in which two or more hydrogen atoms have been removed from a bicycloalkane, tricycloalkane or tetracycloalkane or the like. Specific examples include groups in which two or more hydrogen atoms have been removed from a polycycloalkane such as adamantane, norbornane, isobornane, tricyclodecane or tetracyclododecane. These types of polycyclic alicyclic groups can be selected appropriately from the multitude of groups proposed for the polymer (resin component) of resist compositions designed for use with ArF excimer lasers. Of these polycyclic groups, an adamantyl group, norbornyl group, or tetracyclododecanyl group is preferred industrially.

When the hydrocarbon group within the polar group-containing aliphatic hydrocarbon group is a straight-chain or branched hydrocarbon group of 1 to 10 carbon atoms, the structural unit (a3) is preferably a structural unit derived from the hydroxyethyl ester of the (α-lower alkyl) acrylic acid, whereas when the hydrocarbon group is a polycyclic group, structural units represented by formulas (a3-1) and (a3-2) shown below are preferred.

[Formula 15]

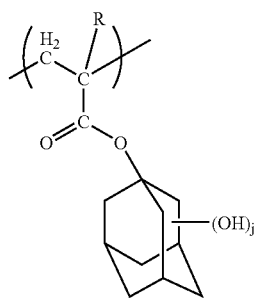

(a3-1)

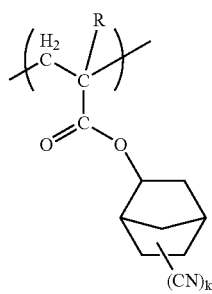

(a3-2)

(wherein, R is as defined above, j represents an integer from 1 to 3, and k represents an integer from 1 to 3)

In the formula (a3-1), the value of j is preferably 1, and structural units in which the hydroxyl group is bonded to position 3 of the adamantyl group are particularly preferred.

In the formula (a3-2), the value of k is preferably 1. These structural units exist as a mixture of isomers (that is, a mixture of compounds in which the cyano group is bonded to either position 4 or position 5 of the norbornyl group).

As the structural unit (a3), either a single type of structural unit may be used alone, or a combination of two or more different structural units may be used.

From the viewpoint of maximizing the effect of the present invention, the proportion of the structural unit (a3) within the polymer compound (A1), relative to the combined total of all the structural units that constitute the polymer compound (A1), is preferably within a range from 5 to 50 mol %, and even more preferably from 10 to 35 mol %.

Structural Unit (a4)

In addition to the structural units (a1) to (a3) described above, the polymer compound (A1) preferably also includes a structural unit (a4) derived from an (α-lower alkyl) acrylate ester that contains a lactone-containing monocyclic or polycyclic group.

The lactone-containing monocyclic or polycyclic group of the structural unit (a4) is effective in improving the adhesion between the resist film and the substrate, and in enhancing the hydrophilicity, thereby improving the affinity with the developing solution, when the polymer compound (A1) is used in the formation of a resist film.

Here, the term "lactone" refers to a single ring containing a —O—C(O)— structure, and this ring is counted as the first ring. Accordingly, the case in which the only ring structure is the lactone ring is referred to as a monocyclic group, and groups containing other ring structures are described as polycyclic groups regardless of the structure of the other rings.

There are no particular restrictions on the structural unit (a4), and any unit that includes both the above type of lactone structure (—O—C(O)—) and a cyclic group can be used.

Specific examples of lactone-containing monocyclic groups include groups in which one hydrogen atom has been removed from γ-butyrolactone. Furthermore, examples of lactone-containing polycyclic groups include groups in which one hydrogen atom has been removed from a lactone ring-containing bicycloalkane, tricycloalkane or tetracycloalkane. Groups in which one hydrogen atom has been removed from a lactone-containing tricycloalkane with the type of structural formula shown below are preferred for reasons such as industrial availability.

[Formula 16]

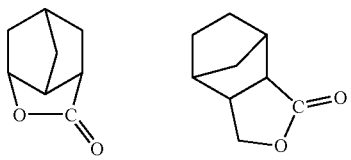

More specific examples of the structural unit (a4) include the structural units represented by general formulas (a4-1) to (a4-5) shown below.

[Formula 17]

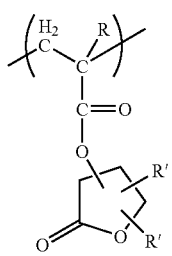

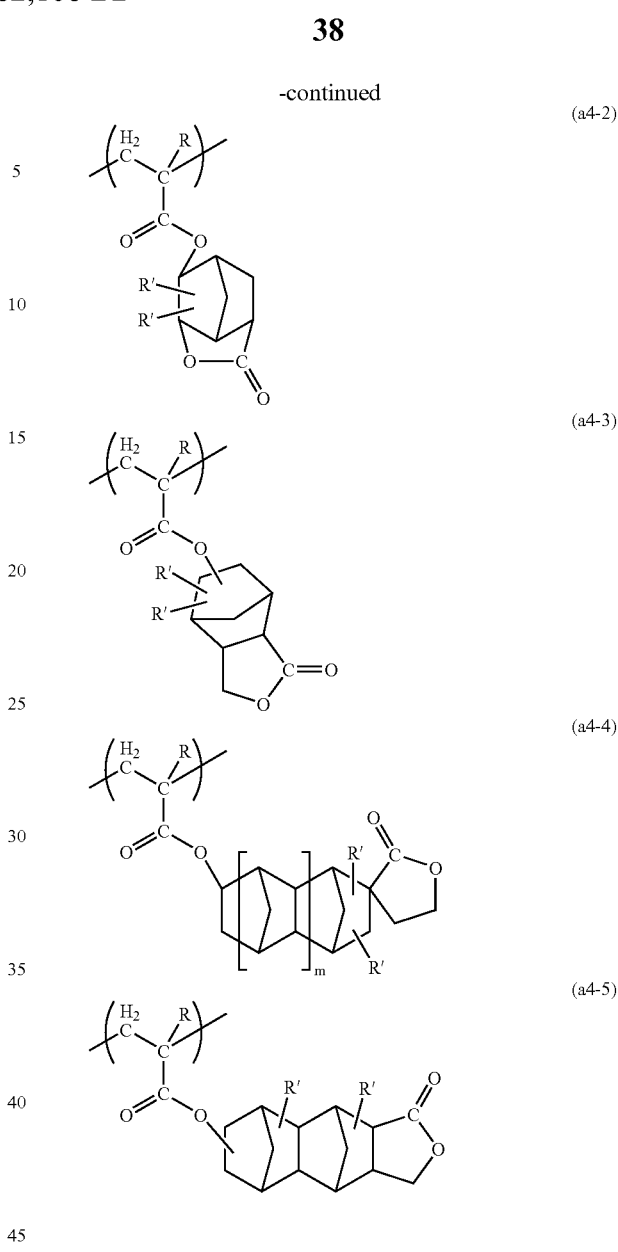

(wherein, R represents a hydrogen atom or a lower alkyl group, each R' represents, independently, a hydrogen atom, lower alkyl group, or alkoxy group of 1 to 5 carbon atoms, and m represents an integer of either 0 or 1)

For the lower alkyl groups of R and R' in the general formulas (a4-1) to (a4-5), the same description applies as that used for the lower alkyl group of R in the above structural unit (a1).

In the general formulas (a4-1) to (a4-5), from the viewpoints of factors such as industrial availability, R' is preferably a hydrogen atom.

In the polymer compound (A1), as the structural unit (a4), either a single type of structural unit may be used alone, or a combination of two or more different structural units may be used.

The proportion of the structural unit (a4) within the polymer compound (A1), relative to the combined total of all the structural units that constitute the polymer compound (A1), is preferably within a range from 5 to 60 mol %, and even more preferably from 10 to 50 mol %. Ensuring that this proportion is at least as large as the lower limit of the above range enables the effects obtained by including the structural unit (a4) to be more readily realized, whereas ensuring that the proportion is no greater than the upper limit enables a more favorable balance to be achieved with the other structural units.

In the present invention, those cases in which the polymer compound (A1) is either a copolymer or a polymer mixture containing all of the structural units (a1) to (a4) are preferred as they yield superior effects for the present invention, and copolymers formed from the structural units (a1) to (a4) are particularly desirable.

Structural Unit (a5)

The polymer compound (A1) may also include other structural units (a5) besides the structural units (a1) to (a4), provided the inclusion of these other units does not impair the effects of the present invention.

As the structural unit (a5), any other structural unit that cannot be classified as one of the above structural units (a1) through (a4) can be used without any particular restrictions, and any of the multitude of conventional structural units used within resist resins for ArF excimer lasers or KrF excimer lasers (and particularly for ArF excimer lasers) can be used.

As the structural unit (a5), a structural unit that contains a non-acid-dissociable aliphatic polycyclic group, and is also derived from an (α-lower alkyl) acrylate ester is preferred. Examples of this polycyclic group include the same groups as those described above in relation to the aforementioned structural unit (a1), and any of the multitude of conventional polycyclic groups used within the resin component of resist compositions for ArF excimer lasers or KrF excimer lasers (and particularly for ArF excimer lasers) can be used.

In particular, at least one polycyclic group selected from amongst a tricyclodecanyl group, adamantyl group, tetracyclododecanyl group, isobornyl group, and norbornyl group is preferred from the viewpoints of factors such as industrial availability.

Specific examples of the structural unit (a5) include units with structures represented by the general formulas (a5-1) to (a5-3) shown below.

[Formula 18]

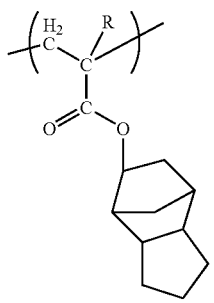

(a5-1)

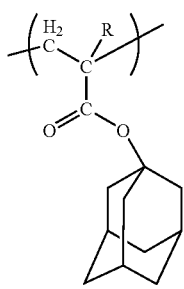

(a5-2)

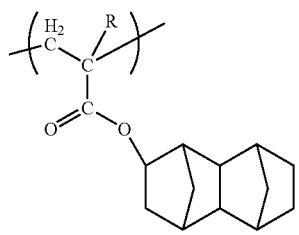

(a5-3)

(wherein, R is as defined above)

Although the structural unit (a5) is not an essential component of the polymer compound (A1), if included, the proportion of the structural unit (a5), relative to the combined total of all the structural units that constitute the polymer compound (A1), is typically within a range from 1 to 30 mol %, and is preferably from 10 to 20 mol %.

The polymer compound (A1) can be obtained, for example, by a conventional radical polymerization or the like of the monomers corresponding with each of the structural units, using a radical polymerization initiator such as azobisisobutyronitrile (AIBN).

Although there are no particular restrictions on the weight average molecular weight (Mw) (the polystyrene equivalent value determined by gel permeation chromatography) of the polymer compound (A1), values within a range from 2,000 to 30,000, preferably from 2,000 to 20,000, and even more preferably from 2,500 to 12,000 are the most desirable from the viewpoint of the effects of the present invention. Furthermore, the polydispersity (Mw/Mn) is preferably within a range from 1.0 to 5.0, and even more preferably from 1.0 to 3.0.

In a polymer compound (A1) of the present invention, exposure causes the generation of sulfonate ions (i.e., generation of acid) from the structural unit (a2). As a result, the polymer compound (A1) can be used as an acid generator.

Furthermore, because the polymer compound (A1) includes the structural unit (a1) having an acid-dissociable, dissolution-inhibiting group, and the structural unit (a2) that generates sulfonate ions on exposure, namely, a unit that functions as an acid generator and generates acid upon exposure, this polymer compound combines the function of a base resin component within a conventional chemically amplified positive resist (namely, a resin component that undergoes increased alkali solubility upon exposure) and the function of an acid generator. As a result, the polymer compound (A1) is capable of forming a resist itself, or alternatively, the polymer compound can either function as the resin component within a resist composition, or function as the acid generator.

<<Acid Generator of the Second Aspect>>

An acid generator of the second aspect (hereafter also referred to as the acid generator (B1)) is formed from a polymer compound (A1) of the first aspect described above.

The acid generator (B1) may include either a single polymer compound (A1) or a combination of two or more different polymer compounds (A1).

<<Positive Resist Composition of the Third Aspect>>

A positive resist composition of this aspect includes a polymer compound (A1) of the first aspect described above.

The proportion of the polymer compound (A1) within the positive resist composition can be adjusted appropriately in accordance with the desired resist film thickness.

In addition to the polymer compound (A1), a positive resist composition of this aspect preferably also includes a polymer compound (A2) that does not contain an aforementioned structural unit (a2). This improves the mask reproducibility.

There are no particular restrictions on the polymer compound (A2), provided it does not contain a structural unit (a2), although resins that exhibit increased alkali solubility under the action of acid are preferred. Examples of such resins that exhibit increased alkali solubility under the action of acid include one or more resins selected from amongst the various resins used as resin components within conventional chemically amplified positive resists.

Specific examples of the polymer compound (A2) include polymer compounds (hereafter referred to as a polymer compound (A2-1)) containing the aforementioned structural units (a1), (a3), and/or (a4).

In a polymer compound (A2-1), the proportion of the structural unit (a1), relative to the combined total of all the structural units that constitute the polymer compound (A2-1), is preferably within a range from 5 to 80 mol %, and even more preferably from 10 to 70 mol %. Furthermore, the proportion of the structural unit (a3), relative to the combined total of all the structural units that constitute the polymer compound (A2-1), is preferably within a range from 5 to 50 mol %, and even more preferably from 10 to 40 mol %. Furthermore, the proportion of the structural unit (a4), relative to the combined total of all the structural units that constitute the polymer compound (A2-1), is preferably within a range from 5 to 80 mol %, and even more preferably from 10 to 60 mol %.

The polymer compound (A2-1) may also include an aforementioned structural unit (a5).

The weight average molecular weight of the polymer compound (A2-1) is preferably within a range from 5,000 to 30,000, and even more preferably from 6,000 to 20,000. Furthermore, the polydispersity (Mw/Mn) is preferably within a range from 1.0 to 5.0, and even more preferably from 1.0 to 3.0.

There are no particular restrictions on the proportion of the polymer compound (A2) within the positive resist composition, although in order to ensure a satisfactory manifestation of the effects achieved by blending the polymer compound (A2), the two polymer compounds are preferably mixed together in a ratio of polymer compound (A1): polymer compound (A2)=9:1 to 1:9 (weight ratio), more preferably from 8:2 to 2:8, most preferably from 5:5 to 2:8.

Furthermore, a positive resist composition of this aspect may also include, either in addition to the polymer compound (A1) or in addition to the polymer compound (A1) and the polymer compound (A2), a conventional acid generator (hereafter also referred to as the acid generator (B2)) used in a conventional chemically amplified resist composition.

Examples of these acid generators (B2) are numerous, and include onium salt-based acid generators such as iodonium salts and sulfonium salts, oxime sulfonate-based acid generators, diazomethane-based acid generators such as bisalkyl or bisaryl sulfonyl diazomethanes and poly(bis-sulfonyl)diazomethanes, nitrobenzyl sulfonate-based acid generators, iminosulfonate-based acid generators, and disulfone-based acid generators.

Specific examples of suitable onium salt-based acid generators include diphenyliodonium trifluoromethanesulfonate or nonafluorobutanesulfonate, bis(4-tert-butylphenyl)iodonium trifluoromethanesulfonate or nonafluorobutanesulfonate, triphenylsulfonium trifluoromethanesulfonate, heptafluoropropanesulfonate or nonafluorobutanesulfonate, tri(4-methylphenyl)sulfonium trifluoromethanesulfonate, heptafluoropropanesulfonate or nonafluorobutanesulfonate, dimethyl(4-hydroxynaphthyl)sulfonium trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, diphenylmonomethylsulfonium trifluoromethanesulfonate, heptafluoropropanesulfonate or nonafluorobutanesulfonate, (4-methylphenyl)diphenylsulfonium trifluoromethanesulfonate, heptafluoropropanesulfonate or nonafluorobutanesulfonate, (4-methoxyphenyl) diphenylsulfonium trifluoromethanesulfonate, heptafluoropropanesulfonate or nonafluorobutanesulfonate, and tri(4-tert-butyl)phenylsulfonium trifluoromethanesulfonate, heptafluoropropanesulfonate or nonafluorobutanesulfonate.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino) 1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-1-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Furthermore, specific examples of poly(bis-sulfonyl)diazomethanes include the structures shown below, such as 1,3-bis(phenylsulfonyldiazomethylsulfonyl)propane (compound A, decomposition point 135° C.), 1,4-bis(phenylsulfonyldiazomethylsulfonyl)butane (compound B, decomposition point 147° C.), 1,6-bis(phenylsulfonyldiazomethylsulfonyl)hexane (compound C, melting point 132° C., decomposition point 145° C.), 1,10-bis(phenylsulfonyldiazomethylsulfonyl)decane (compound D, decomposition point 147° C.), 1,2-bis(cyclohexylsulfonyldiazomethylsulfonyl)ethane (compound E, decomposition point 149° C.), 1,3-bis(cyclohexylsulfonyldiazomethylsulfonyl)propane (compound F, decomposition point 153° C.), 1,6-bis(cyclohexylsulfonyldiazomethylsulfonyl)hexane (compound G, melting point 109° C., decomposition point 122° C.), and 1,10-bis(cyclohexylsulfonyldiazomethylsulfonyl)decane (compound H, decomposition point 116° C.).

[Formula 19]

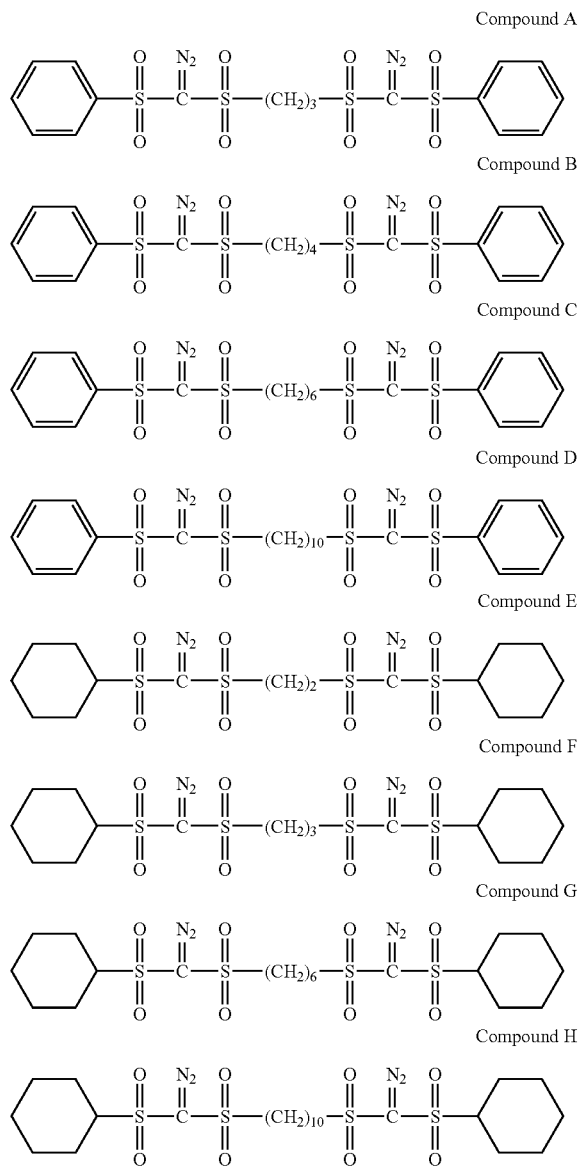

Compound A

Compound B

Compound C

Compound D

Compound E

Compound F

Compound G

Compound H

As the acid generator (B2), either a single acid generator from the above possibilities may be used alone, or a combination of two or more different acid generators may be used.

In a positive resist composition, the quantity used of the acid generator (B2) is typically no more than 10 parts by weight, and preferably within a range from 0.1 to 5 parts by weight, per 100 parts by weight of the resin component that contains the polymer compound (A1). If this quantity exceeds 10 parts by weight, then there is a danger of losing the effect of the present invention (namely, reduction of LER).

A positive resist composition of the present invention can be produced by dissolving the aforementioned polymer compound (A1), optional components including the polymer compound (A2) and/or the acid generator (B2), and the various optional components described below, in an organic solvent (hereafter also referred to as the component (C)).

The component (C) may be any solvent capable of dissolving each of the components used to generate a uniform solution, and either one, or two or more solvents selected from known materials used as the solvents for conventional chemically amplified resists can be used. Suitable examples include lactones such as γ-butyrolactone; ketones such as acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol, or the monomethyl ether, monoethyl ether, monopropyl ether, monobutyl ether or monophenyl ether of dipropylene glycol monoacetate; cyclic ethers such as dioxane; and esters such as methyl lactate, ethyl lactate (EL), methyl acetate, ethyl acetate, butyl acetate, methyl pyruvate, ethyl pyruvate, methyl methoxypropionate, and ethyl ethoxypropionate.

As the component (C), these organic solvents may be used either alone, or as a mixed solvent of two or more different solvents.

Furthermore, a mixed solvent of propylene glycol monomethyl ether acetate (PGMEA) and a polar solvent is preferred. In such cases, the mixing ratio (weight ratio) can be determined on the basis of the co-solubility of the PGMEA and the polar solvent, but is preferably within a range from 1:9 to 9:1, and even more preferably from 2:8 to 8:2.

More specifically, in those cases where EL is added as the polar solvent, the weight ratio of PGMEA:EL is preferably within a range from 1:9 to 9:1, and even more preferably from 2:8 to 8:2.

Furthermore, as the organic solvent, a mixed solvent of at least one of PGMEA and EL, together with γ-butyrolactone is also preferred. In such cases, the mixing ratio is set so that the weight ratio between the former and latter components is preferably within a range from 70:30 to 95:5.

There are no particular restrictions on the quantity used of the component (C), which is set in accordance with the desired film thickness so as to produce a concentration that enables favorable application to a substrate or the like, and is typically sufficient to produce a solid fraction concentration within the resist composition of 2 to 20% by weight, and preferably from 5 to 15% by weight.

In a positive resist composition of the present invention, in order to improve the resist pattern shape and the post exposure stability of the latent image formed by the pattern-wise exposure of the resist layer, a nitrogen-containing organic compound (D) (hereafter referred to as the component (D)) may be added as an optional component.

A multitude of these components (D) have already been proposed, and any of these known compounds may be used, although an aliphatic amine, and particularly a secondary aliphatic amine or tertiary aliphatic amine is preferred.

Examples of these aliphatic amines include amines in which at least one hydrogen atom of ammonia $NH_3$ has been substituted with an alkyl group or hydroxyalkyl group of no more than 12 carbon atoms (that is, alkylamines or alkyl alcohol amines). Specific examples of these aliphatic amines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, and tri-n-octanolamine.

These compounds can be used either alone, or in combinations of two or more different compounds.

The component (D) is typically used in a quantity within a range from 0.01 to 5.0 parts by weight per 100 parts by weight of the component (A). Of the above amines, alkyl alcohol amines and trialkylamines are preferred, and alkyl alcohol amines are the most desirable. Amongst the various alkyl alcohol amines, triethanolamine and triisopropanolamine are the most preferred.

Furthermore, in a positive resist composition of the present invention, in order to prevent any deterioration in sensitivity caused by the addition of the above component (D), and improve the resist pattern shape and the post exposure stability of the latent image formed by the pattern-wise exposure of the resist layer, an organic carboxylic acid, or a phosphorus oxo acid or derivative thereof (E) (hereafter referred to as the component (E)) can also be added as another optional component. The component (D) and the component (E) can be used in combination, or either one can also be used alone.

Examples of suitable organic carboxylic acids include malonic acid, citric acid, malic acid, succinic acid, benzoic acid, and salicylic acid.

Examples of suitable phosphorus oxo acids or derivatives thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid, and of these, phosphonic acid is particularly preferred.

The component (E) is typically used in a quantity within a range from 0.01 to 5.0 parts by weight per 100 parts by weight of the component (A).

Other miscible additives can also be added to a positive resist composition of the present invention according to need, and examples include additive resins for improving the performance of the resist film, surfactants for improving the ease of application, dissolution inhibitors, plasticizers, stabilizers, colorants, halation prevention agents, and dyes.

<<Positive Resist Composition of the Fourth Aspect>>

A positive resist composition of this aspect includes a resin component (A) (hereafter referred to as the component (A)) that exhibits increased alkali solubility under the action of acid, and an acid generator component (B) (hereafter referred to as the component (B)) that generates acid on exposure.

<Component (A)>

A positive resist composition of this aspect includes an aforementioned polymer compound (A1) of the present invention as the component (A).

In order to ensure a satisfactory effect for the present invention, the proportion of the polymer compound (A1) within the component (A) is preferably at least 50% by weight, is even more preferably within a range from 80 to 100% by weight, and is most preferably 100% by weight.

In the present invention, the component (A) may also include, in addition to the polymer compound (A1), the types of resins typically used as chemically amplified positive resist resins. Such resins do not contain the structural unit (a2) from the polymer compound (A1), but do include the structural unit (a1), and may also include at least one structural unit selected from amongst the structural units (a3) to (a5), with specific examples including the aforementioned polymer compounds (A2-1).

The proportion of the component (A) within the positive resist composition can be adjusted appropriately in accordance with the desired resist film thickness.

<Component (B)>

There are no particular restrictions on the component (B), and any of the compounds proposed for use as acid generators within conventional chemically amplified resists can be used. Examples of such acid generators include the acid generators (B2) described above.

The quantity of the component (B) within the positive resist composition is preferably within a range from 0.1 to 10 parts by weight, and even more preferably from 1 to 5 parts by weight, per 100 parts by weight of the component (A).

A positive resist composition of the present invention can be produced in a similar manner to that described above, by dissolving the component (A), the component (B), together with the aforementioned optional components (D) and (E), in a component (C).

The respective blend quantities of each of these components are as described above.

<<Positive Resist Composition of the Fifth Aspect>>

A positive resist composition of this aspect includes a component (A) and a component (B).

<Component (B)>

A positive resist composition of this aspect includes an aforementioned acid generator (B1) of the present invention as the component (B).

In order to ensure a satisfactory effect for the present invention, the proportion of the acid generator (B1) within the component (B) is preferably at least 50% by weight, is even more preferably within a range from 80 to 100% by weight, and is most preferably 100% by weight.

The quantity of the acid generator (B1) within the positive resist composition, for example in the case in which the skeleton of the acid generator (B1) contains from 0.01 to 70 mol % of the aforementioned structural unit (a2), is preferably within a range from 5 to 80 parts by weight, and even more preferably from 20 to 50 parts by weight, per 100 parts by weight of the component (A).

Furthermore, the quantity of the structural unit (a2) within the skeleton of the acid generator (B1) is even more preferably within a range from 0.1 to 50 mol %, even more preferably from 1 to 30 mol %, and is most preferably from 1 to 15 mol %.

In the present invention, the component (B) may also include, in addition to the acid generator (B1), any of the compounds typically used as acid generators within conventional chemically amplified positive resists, provided such inclusion does not impair the effects of the present invention. Examples of these other acid generators include the acid generators (B2) described above.

<Component (A)>

There are no particular restrictions on the component (A), and any of the resins that have been proposed for conventional chemically amplified positive resist resins can be used. Examples of such resins include those that do not contain the structural unit (a2) from the aforementioned polymer compound (A1), but do include the structural unit (a1), and may also include at least one structural unit selected from amongst the structural units (a3) to (a5), with specific examples including the aforementioned polymer compounds (A2-1).

The proportion of the component (A) within the positive resist composition can be adjusted appropriately in accordance with the desired resist film thickness.

A positive resist composition of the present invention can be produced in a similar manner to that described above, by dissolving the component (A), the component (B), together with the aforementioned optional components (D) and (E), in a component (C).

The respective blend quantities of each of these components are as described above.

<<Method for Forming a Resist Pattern of Sixth Aspect>>

A method for forming a resist pattern according to the present invention can be conducted, for example, in the manner described below.

Namely, a positive resist composition described above is first applied to a support such as a silicon wafer using a spinner or the like, a prebake is then conducted under temperature conditions of 80 to 150° C., for a period of 40 to 120 seconds, and preferably for 60 to 90 seconds, and following selective exposure of the thus obtained film with an ArF exposure apparatus or the like, by irradiating ArF excimer laser light through a desired mask pattern, PEB (post exposure baking) is conducted under temperature conditions of 80 to 150° C., for a period of 40 to 120 seconds, and preferably for 60 to 90 seconds. Subsequently, developing is conducted using an alkali developing solution such as a 0.1 to 10% by weight aqueous solution of tetramethylammonium hydroxide. In this manner, a resist pattern that is faithful to the mask pattern can be obtained.

An organic or inorganic anti-reflective film may also be provided between the support (substrate) and the applied layer of the resist composition.

There are no particular restrictions on the wavelength used for the exposure, and an ArF excimer laser, KrF excimer laser, $F_2$ excimer laser, or other radiation such as EUV (extreme ultraviolet), VUV (vacuum ultraviolet), EB (electron beam), X-ray or soft X-ray radiation can be used. A photoresist composition according to the present invention is particularly effective for use with an ArF excimer laser.

A resist pattern obtained using a positive resist composition that contains an aforementioned polymer compound of the present invention exhibits reduced LER and excellent resolution.

The reasons why the present invention enables the formation of a resist pattern with reduced LER and excellent resolution are not entirely clear, but the following reasons are thought possible. Namely, in a conventional resist composition that uses a low molecular weight acid generator, the various components appear, at first glance, to be mixed together uniformly. However, it is believed that heating and the like conducted during film formation causes localized concentration of the acid generator at various portions throughout the resist film, and it is thought that this localization causes the dissociation (deprotection) of the acid-dissociable, dissolution-inhibiting groups to proceed in a non-uniform manner within the resin, resulting in the occurrence of LER.

In contrast, the polymer compound (A1) of the present invention includes the structural unit (a2) that is capable of generating a sulfonate ion, which means that a group that is capable of generating an acid, namely an acid-generating group, exists within the resin itself. Consequently localized concentration of the acid generator can be prevented, meaning a more uniform dispersion of the acid generator can be expected. For this reason, uniform deprotection can be achieved, which should result in an improvement in LER and resolution. Furthermore, because the polymer compound includes an acid-generating group, it is thought that diffusion of the acid (sulfonate ions) generated by exposure through the resist film will be inhibited, and this effect should also result in further improvement in the level of LER and the resolution.

In addition, a resist pattern obtained using a positive resist composition that includes a polymer compound of the present invention also exhibits a favorable MEF (mask error factor). The MEF is a parameter that indicates how faithfully mask patterns of differing line width or hole diameter can be reproduced using the same exposure dose (namely, the mask reproducibility), and is determined using the formula shown below. The MEF is preferably as close as possible to 1.

$$MEF = |CD_x - CD_y| / |MD_x - MD_y|$$

In this formula, $MD_x$ and $MD_y$ represent the sizes (nm) of two different mask patterns, and $CD_x$ and $CD_y$ represent the respective sizes (nm) of the resist patterns formed using each of the mask patterns.

Moreover, in the present invention, because a high-resolution resist pattern with a reduced level of LER can be formed, a reduction in the level of resist pattern defects can also be expected. Pattern defects refer to general abnormalities detected by inspection of the resist pattern following developing, from directly above the resist pattern, using a surface defect inspection device (brand name: KLA) from KLA Tencor Corporation. Examples of these abnormalities include post-developing scum, foam, dust, pattern collapse, bridges across different portions of the resist pattern, color irregularities, and foreign deposits.

EXAMPLES

As follows is a description of examples of the present invention, although the scope of the present invention is in no way limited by these examples.

The respective structures of monomer components (1) through (4) used in the following synthesis examples are shown below.

[Formula 20]

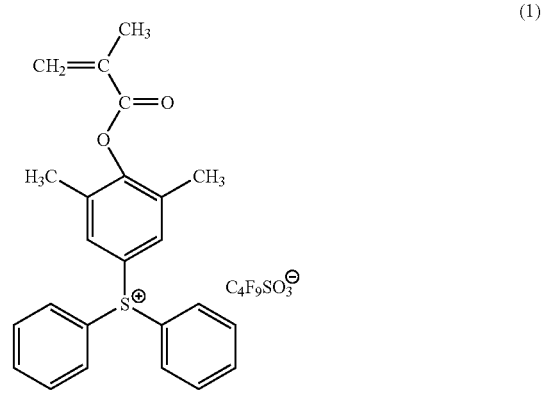

(1)

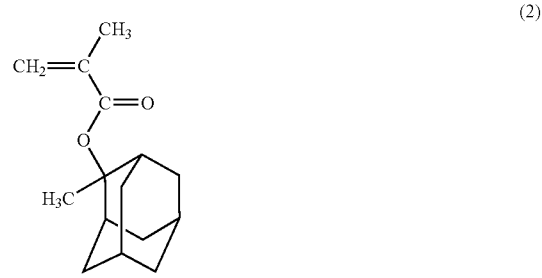

(2)

-continued (3)

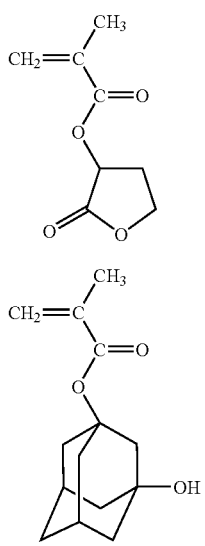

(4)

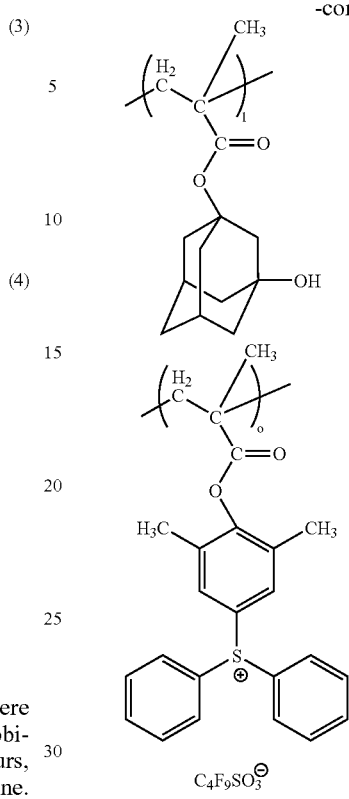

Synthesis Example 1

4.3 g of (1), 6.0 g of (2), 4.3 g of (3), and 3.0 g of (4) were dissolved in 100 ml of tetrahydrofuran, and 0.58 g of azobisisobutyronitrile was added. Following refluxing for 6 hours, the reaction solution was added dropwise to 1 L of n-heptane. The precipitated resin was collected by filtration and dried under reduced pressure, yielding a white resin powder. This resin was termed resin 1, and the structural formula for the resin is shown below. The weight average molecular weight (Mw) of the resin 1 was 2,700, and the polydispersity (Mw/Mn) was 1.56. Furthermore, analysis by carbon-13 nuclear magnetic resonance spectroscopy ($^{13}$C-NMR) revealed a compositional ratio (molar ratio) between each of the structural units shown in the structural formula below of m:n:l:o=26.2:40.3:20.5:13.0.

[Formula 21]

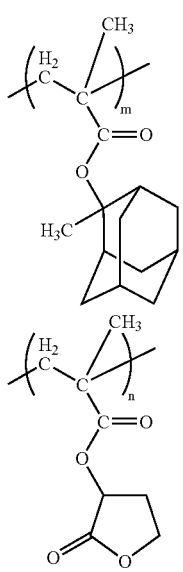

Synthesis Example 2

3.6 g of (1), 10.0 g of (2), 7.2 g of (3), and 5.0 g of (4) were dissolved in 100 ml of tetrahydrofuran, and 0.92 g of azobisisobutyronitrile was added. Following refluxing for 6 hours, the reaction solution was added dropwise to 1 L of n-heptane. The precipitated resin was collected by filtration and dried under reduced pressure, yielding a white resin powder. This resin was termed resin 2. The structural formula for the resin 2 is the same as that of the above resin 1. The weight average molecular weight (Mw) of the resin 2 was 3,600, and the polydispersity (Mw/Mn) was 1.70. Furthermore, analysis by carbon-13 nuclear magnetic resonance spectroscopy ($^{13}$C-NMR) revealed a compositional ratio (molar ratio) between each of the structural units shown in the above structural formula of m:n:l:o=29.9:41.5:21.9:6.7.

Synthesis Example 3

0.7 g of (1), 10.0 g of (2), 7.2 g of (3), and 5.0 g of (4) were dissolved in 100 ml of tetrahydrofuran, and 0.35 g of azobisisobutyronitrile was added. Following refluxing for 6 hours, the reaction solution was added dropwise to 1 L of n-heptane. The precipitated resin was collected by filtration and dried under reduced pressure, yielding a white resin powder. This resin was termed resin 3. The structural formula for the resin 3 is the same as that of the above resin 1. The weight average molecular weight (Mw) of the resin 3 was 10,400, and the polydispersity (Mw/Mn) was 2.30. Furthermore, analysis by carbon-13 nuclear magnetic resonance spectroscopy ($^{13}$C-NMR) revealed a compositional ratio (molar ratio) between each of the structural units shown in the above structural formula of m:n:l:o=35.5:39.3:23.7:1.5.

Comparative Synthesis Example 1

18.7 g of (2), 13.6 g of (3), and 9.5 g of (4) were dissolved in 200 ml of tetrahydrofuran, and 1.64 g of azobisisobutyronitrile was added. Following refluxing for 6 hours, the reaction solution was added dropwise to 1 L of n-heptane. The precipitated resin was collected by filtration and dried under reduced pressure, yielding a white resin powder. This resin was termed resin 4, and the structural formula for the resin is shown below. The weight average molecular weight (Mw) of the resin 4 was 13,300, and the polydispersity (Mw/Mn) was 2.5.

Furthermore, analysis by carbon-13 nuclear magnetic resonance spectroscopy ($^{13}$C-NMR) revealed a compositional ratio (molar ratio) between each of the structural units shown in the structural formula below of m:n:l=33.6:43.8:22.6.

[Formula 22]

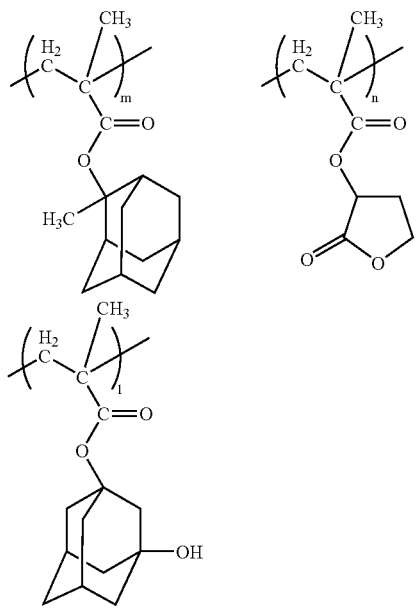

The composition (molar ratio), weight average molecular weight (Mw), and polydispersity for each of the resins 1 to 4 are shown in Table 1.

TABLE 1

| | Composition ratio (molar ratio) | | | | Weight average molecular weight | Polydispersity |
|---|---|---|---|---|---|---|
| | m | n | l | o | | |
| Resin 1 | 26.2 | 40.3 | 20.5 | 13.0 | 2,700 | 1.56 |
| Resin 2 | 29.9 | 41.5 | 21.9 | 6.7 | 3,600 | 1.70 |
| Resin 3 | 35.5 | 39.3 | 23.7 | 1.5 | 10,400 | 2.30 |
| Resin 4 | 33.6 | 43.8 | 22.6 | — | 13,300 | 2.50 |

Examples 1 and 2, Comparative Example 1

Using the compositions and blend quantities (parts by weight) shown in Table 2, a resin component, an acid generator, and a nitrogen-containing organic compound were dissolved in an organic solvent, yielding a positive resist composition.

TABLE 2

| | Resin component | Acid generator | Nitrogen-containing organic compound | Organic solvent |
|---|---|---|---|---|
| Example 1 | Resin 3 (100) | | Triethanolamine (0.4) | PGMEA (1150) |
| Example 2 | Resin 2 + Resin 4 (30 + 70) | | Triethanolamine (0.3) | PGMEA (1150) |
| Comparative Example 1 | Resin 4 (100) | TPS-PFBS (3.0) | Triethanolamine (0.3) | PGMEA (1150) |

TPS-PFBS: triphenylsulfonium nonafluorobutanesulfonate
PGMEA: propylene glycol monomethyl ether acetate Subsequently, an organic anti-reflective film material (product name: ARC-29, manufactured by Brewer Science Ltd.) was applied to the surface of an 8-inch silicon wafer, and the composition was then baked at 225° C. for 60 seconds, thereby forming an anti-reflective film with a film thickness of 77 nm, and completing preparation of a substrate.

The positive resist composition prepared above was then applied uniformly to the surface of this substrate using a spinner, and was then prebaked and dried on a hotplate at 130° C. for 90 seconds, thereby forming a resist layer with a film thickness of 250 nm. The thus obtained resist layer was then selectively exposed through a 6% half-tone mask, using an ArF exposure apparatus (wavelength:193 nm) NSR-S302 (manufactured by Nikon Corporation, NA (numerical aperture)=0.60, ⅔ annular illumination).

A PEB treatment was then conducted at 130° C. for 90 seconds, and the resist film was subjected to puddle development for 30 seconds at 23° C. in a 2.38% by weight aqueous solution of tetramethylammonium hydroxide, and was then rinsed for 30 seconds with pure water and shaken dry, completing formation of a 130 nm line and space (1:1) resist pattern (hereafter referred to as a L/S pattern).

The evaluations described below were then conducted, the results of which are shown in Table 3.

<Resolution>

The critical resolution is shown at the sensitivity level required for formation of a 1:1 130 nm L/S pattern.

<LER>

For the 1:1 130 nm L/S pattern, the 3σ value, which is a measure of the LER, was determined. The 3σ value is determined by measuring the resist pattern width of the sample at 32 positions using a measuring SEM (product name: S-9220, manufactured by Hitachi, Ltd.), and calculating the value of 3 times the standard deviation σ (namely, 3σ) from these measurement results. The smaller this 3σ value is, the lower the level of roughness, indicating a resist pattern with a uniform width.

<MEF>

L/S patterns were also formed using line and space mask patterns of 130 nm and 200 nm, and the formula shown below was then used to determine the MEF (mask error factor).

$$MEF = |CD_{200} - CD_{130}|/|MD_{200} - MD_{130}|$$

In this formula, $CD_{200}$ and $CD_{130}$ represent the respective resist pattern widths (nm) of the L&S patterns formed using the 200 nm and 130 nm mask patterns, and $MD_{200}$ and $MD_{130}$ represent the respective mask pattern widths (nm), meaning $MD_{200}=200$ and $MD_{130}=130$.

TABLE 3

|  | Resolution | LER | MEF |
|---|---|---|---|
| Example 1 | 120 nm | 9.6 nm | 1.44 |
| Example 2 | 120 nm | 11.1 nm | 1.42 |
| Comparative example 1 | 120 nm | 12.0 nm | 1.49 |

As is evident from the above results, the positive resist composition of Example 1, which used the resin 3 corresponding with a polymer compound (A1), and the positive resist composition of Example 2, which used a mixture of the resin 2 corresponding with a polymer compound (A1) and the resin 4 corresponding with a polymer compound (A2), yielded resist patterns that exhibited high resolution and reduced LER. Furthermore, the MEF values were also favorable.

In contrast, although the positive resist composition of Comparative Example 1, which used the resin 4 corresponding with a polymer compound (A2) and a low molecular weight acid generator, exhibited a high level of resolution, the level of LER was poor. Furthermore, the MEF value was also larger, indicating less favorable mask reproducibility.

INDUSTRIAL APPLICABILITY

The present invention provides a polymer compound capable of forming a positive resist composition that can form a high-resolution pattern with a reduced level of LER, an acid generator formed from such a polymer compound, a positive resist composition that includes such a polymer compound, and a method for forming a resist pattern that uses such a positive resist composition, and is consequently extremely useful industrially.

The invention claimed is:

1. A polymer compound, comprising a structural unit (a1) derived from an (α-lower alkyl) acrylate ester having an acid-dissociable, dissolution-inhibiting group, a structural unit (a2) represented by a general formula (a2-1) shown below:

[Formula 1]

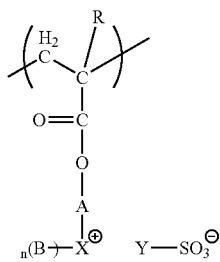

(a2-1)

[wherein, R represents a hydrogen atom or a lower alkyl group; A represents a divalent organic group; B represents a monovalent organic group; X represents a sulfur atom or iodine atom; n represents either 1 or 2; and Y represents a straight-chain, branched or cyclic alkyl group in which at least one hydrogen atom may be substituted with a fluorine atom], and a structural unit (a3) derived from an (α-lower alkyl) acrylate ester that contains a polar group-containing aliphatic polycyclic group.

2. A polymer compound according to claim 1, wherein said structural unit (a2) is represented by a general formula (a2-2) shown below:

[Formula 2]

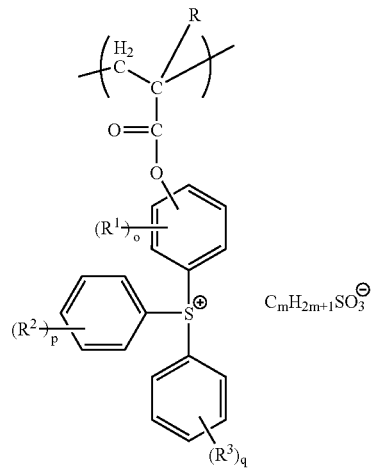

(a2-2)

[wherein, R represents a hydrogen atom or a lower alkyl group; $R^1$ to $R^3$ each represent independently, a straight-chain, branched, or cyclic alkyl group of 1 to 20 carbon atoms, or a hydroxyl group; o, p, and q each represent, independently, either 0 or an integer from 1 to 3; and m represents an integer from 1 to 10, and wherein hydrogen atoms within an anion portion may be substituted with fluorine atoms].

3. A polymer compound according to claim 2, wherein said structural unit (a2) is represented by a general formula (a2-3) shown below:

[Formula 3]

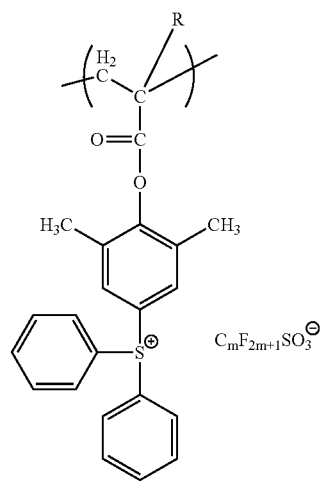

(a2-3)

[wherein, R represents a hydrogen atom or a lower alkyl group; and m represents an integer from 1 to 10].

4. A polymer compound according to claim 1, wherein a proportion of said structural unit (a2), relative to a combined total of all structural units that constitute said polymer compound, is at least 0.01 mol %.

5. A polymer compound according to claim 1, wherein a proportion of said structural unit (a1), relative to a combined total of all structural units that constitute said polymer compound, is within a range from 10 to 80 mol %.

6. A polymer compound according to claim 1, wherein a proportion of said structural unit (a3), relative to a combined total of all structural units tat constitute said polymer compound, is within a range from 5 to 50 mol %.

7. A polymer compound according to claim 1, further comprising a structural unit (a4) derived from an (α-lower alkyl) acrylate ester that contains a lactone-containing monocyclic or polycyclic group.

8. A polymer compound according to claim 7, wherein a proportion of said structural unit (a4), relative to a combined total of all structural units that constitute said polymer compound, is within a range from 5 to 60 mol %.

9. A polymer compound according to claim 1, with a weight average molecular weight within a range from 2,000 to 30,000.

10. An acid generator, comprising a polymer compound according to claim 1.

11. A positive resist composition, comprising a polymer compound according to claim 1.

12. A positive resist composition according to claim 11, further comprising a polymer compound (A2) that does not contain said structural unit (a2).

13. A positive resist composition according to claim 12, wherein said polymer compound (A2) exhibits increased alkali solubility under action of acid.

14. A positive resist composition according to claim 13, wherein said polymer compound (A2) comprises said structural units (a1), (a3), and/or (a4).

15. A positive resist composition, comprising a resin component (A) that exhibits increased alkali solubility under action of acid, and an acid generator component (B) that generates acid on exposure,
wherein said resin component (A) comprises a polymer compound according to claim 1.

16. A positive resist composition, comprising a resin component (A) that exhibits increased alkali solubility under action of acid, and an acid generator component (B) that generates acid on exposure,
wherein said acid generator component (B) comprises an acid generator according to claim 10.

17. A positive resist composition according to claim 11, further comprising a nitrogen-containing organic compound (D).

18. A method for forming a resist pattern, comprising the steps of forming a resist film on a substrate using a positive resist composition according to claim 11, exposing said resist film, and developing said resist film to form a resist pattern.

* * * * *

UNITED STATES PATENT AND TRADEMARK OFFICE
CERTIFICATE OF CORRECTION

PATENT NO.        : 7,482,108 B2
APPLICATION NO.   : 11/572990
DATED             : January 27, 2009
INVENTOR(S)       : Matsumaru et al.

It is certified that error appears in the above-identified patent and that said Letters Patent is hereby corrected as shown below:

Column 4, Line 5-11 (Approx.), Structure (a1-1), change " 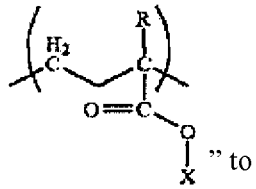 " to

-- 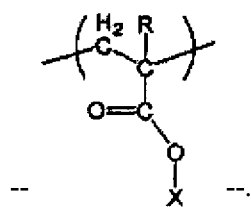 --.

Column 4, Lines 13-24 (Approx.), Structure (a1-2), change " 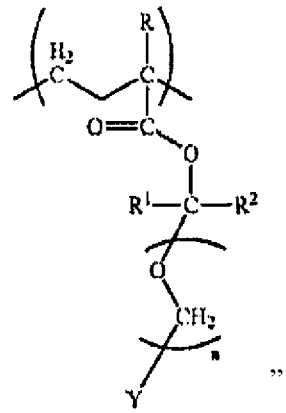 "

to -- 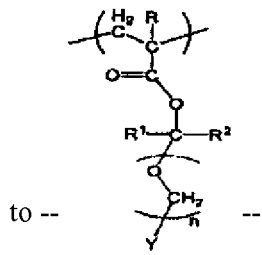 --.

Column 4, Lines 26-40 (Approx.), Structure (a1-3), change " 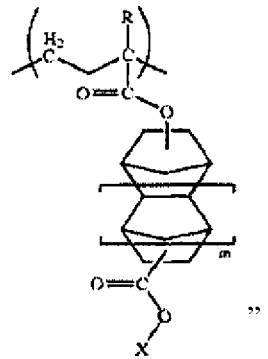 "

UNITED STATES PATENT AND TRADEMARK OFFICE
CERTIFICATE OF CORRECTION

PATENT NO. : 7,482,108 B2
APPLICATION NO. : 11/572990
DATED : January 27, 2009
INVENTOR(S) : Matsumaru et al.

Page 2 of 4

It is certified that error appears in the above-identified patent and that said Letters Patent is hereby corrected as shown below:

Column 4, Lines 41-61, (Approx.), Structure (a1-4), change " 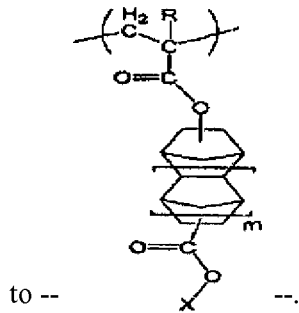 " 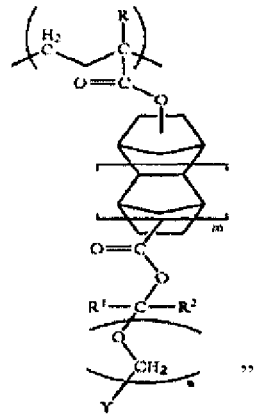

to -- 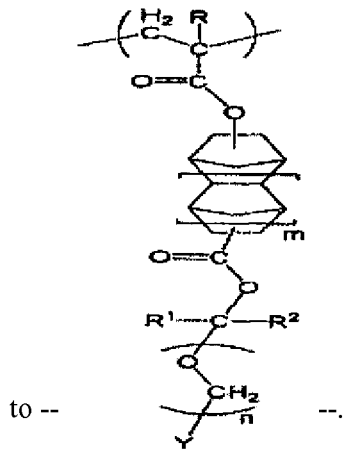 --.

Column 5, Line 28, change "isobomane," to --isobornane,--.

UNITED STATES PATENT AND TRADEMARK OFFICE
CERTIFICATE OF CORRECTION

PATENT NO.       : 7,482,108 B2
APPLICATION NO.  : 11/572990
DATED            : January 27, 2009
INVENTOR(S)      : Matsumaru et al.

It is certified that error appears in the above-identified patent and that said Letters Patent is hereby corrected as shown below:

Column 7, Lines 4-10, (Approx.), Structure (a1-1-12), change

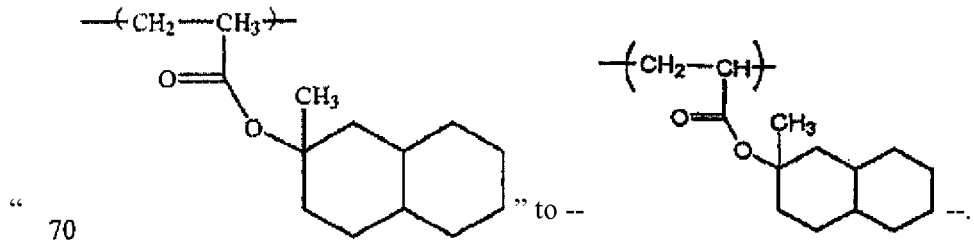

Column 34, Line 55, change "$C_mH_{2m+1},$" to --$C_mH_{2m+1}$--.

Column 35, line 26, after "group]" insert --.--.

Column 35, line 32, change "(Aa1)," to --(A1),--.

Column 36, line 10, change "norbomane," to --norbornane,--.

Column 36, line 10, change "isobomane," to --isobornane,--.

Column 36, line 55, after "3)" insert --.--.

Column 37, line 31, change "y-butyrolactone." to --γ-butyrolactone.--.

Column 38, line 49, after "1)" insert --.--.

Column 39, line 34, change "norbomyl" to --norbornyl--.

Column 40, line 14, after "above)" insert --.--.

Column 42, line 31, change "α-(methylsulfonyloxyimino) 1-cyclopentenyl" to --α-(methylsulfonyloxyimino)-l-cyclopentenyl--.

Column 54, line 28 (Approx.), In Claim 2, change "represent" to --represent,--.

UNITED STATES PATENT AND TRADEMARK OFFICE
CERTIFICATE OF CORRECTION

| | |
|---|---|
| PATENT NO. | : 7,482,108 B2 |
| APPLICATION NO. | : 11/572990 |
| DATED | : January 27, 2009 |
| INVENTOR(S) | : Matsumaru et al. |

It is certified that error appears in the above-identified patent and that said Letters Patent is hereby corrected as shown below:

Column 55, line 7, In claim 6, change "tat" to --that--.

Signed and Sealed this

Thirtieth Day of June, 2009

JOHN DOLL
*Acting Director of the United States Patent and Trademark Office*